United States Patent
You et al.

(10) Patent No.: US 10,755,977 B2
(45) Date of Patent: Aug. 25, 2020

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Jia-Chuan You, Taoyuan (TW); Chia-Hao Chang, Hsinchu (TW); Wei-Hao Wu, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/222,640

(22) Filed: Dec. 17, 2018

(65) Prior Publication Data
US 2019/0139825 A1    May 9, 2019

Related U.S. Application Data

(63) Continuation of application No. 15/907,148, filed on Feb. 27, 2018, now Pat. No. 10,157,790.

(60) Provisional application No. 62/565,028, filed on Sep. 28, 2017.

(51) Int. Cl.
| H01L 21/768 | (2006.01) |
| H01L 29/66 | (2006.01) |
| H01L 21/28 | (2006.01) |
| H01L 21/311 | (2006.01) |
| H01L 23/522 | (2006.01) |
| H01L 21/033 | (2006.01) |

(52) U.S. Cl.
CPC .... *H01L 21/76897* (2013.01); *H01L 21/0332* (2013.01); *H01L 21/0337* (2013.01); *H01L 21/28247* (2013.01); *H01L 21/31144* (2013.01); *H01L 21/76816* (2013.01); *H01L 21/76834* (2013.01); *H01L 21/76843* (2013.01); *H01L 21/76846* (2013.01); *H01L 21/76847* (2013.01); *H01L 21/76849* (2013.01); *H01L 23/5226* (2013.01); *H01L 29/66545* (2013.01); *H01L 21/76883* (2013.01)

(58) Field of Classification Search
CPC ......... H01L 21/76816; H01L 21/76846; H01L 21/76897; H01L 21/76847; H01L 21/76843; H01L 21/31144; H01L 21/0337; H01L 23/5226; H01L 29/66545
See application file for complete search history.

(56) References Cited

U.S. PATENT DOCUMENTS

| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Hsien Ming Lee
(74) *Attorney, Agent, or Firm* — Maschoff Brennan

(57) ABSTRACT

A semiconductor device and a method for manufacturing a semiconductor device are provided. The semiconductor device includes a substrate, a gate stack, a gate spacer, a conductive feature, and a conductive cap. The substrate has a source/drain region. The gate stack is on the substrate. The gate spacer is alongside the gate stack. The conductive feature is on the source/drain region. The conductive cap is on the conductive feature and has a top in a position lower than a top of the gate spacer.

20 Claims, 24 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,170,377 B1* | 1/2019 | Zang ................ H01L 29/66833 |
| 2018/0122919 A1 | 5/2018 | Park et al. |
| 2018/0308751 A1* | 10/2018 | Wang ................ H01L 21/76829 |

\* cited by examiner

SEMICONDUCTOR DEVICE AND METHOD FOR MANUFACTURING THE SAME

RELATED APPLICATIONS

The present application is a continuation application of U.S. application Ser. No. 15/907,148, filed on Feb. 27, 2018, now U.S. Pat. No. 10,157,790, issued on Dec. 18, 2018, which claims priority of U.S. Provisional Application Ser. No. 62/565,028, filed on Sep. 28, 2017, which is herein incorporated by reference in their entireties.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
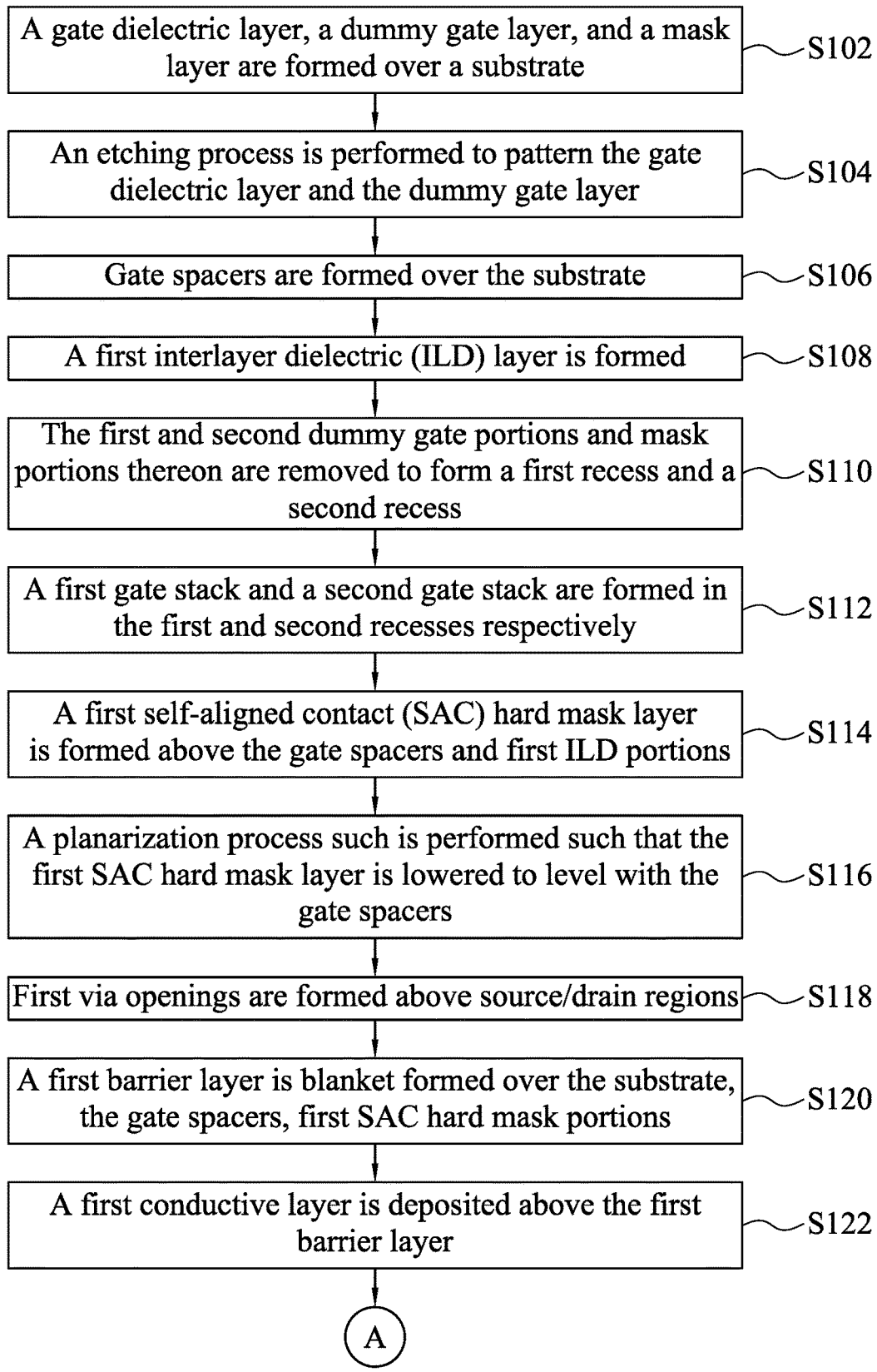
FIGS. 1A and 1B are a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
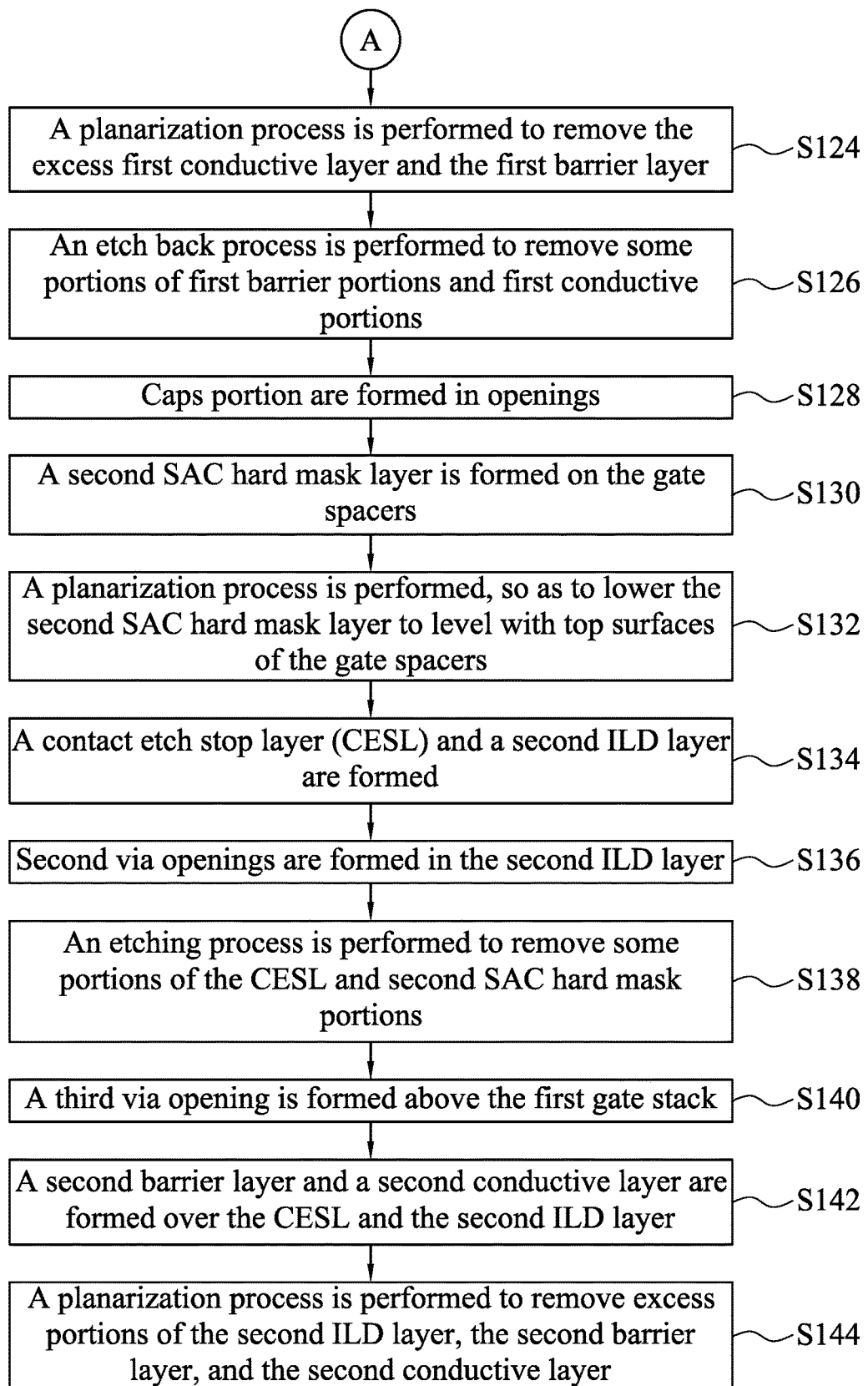

FIGS. 1A and 1B are flowcharts of a method for manufacturing a semiconductor device in accordance with some embodiments of the present disclosure. FIGS. 2-23 illustrate a method of forming a semiconductor device in accordance with some embodiments of the present disclosure.

Figure 2:
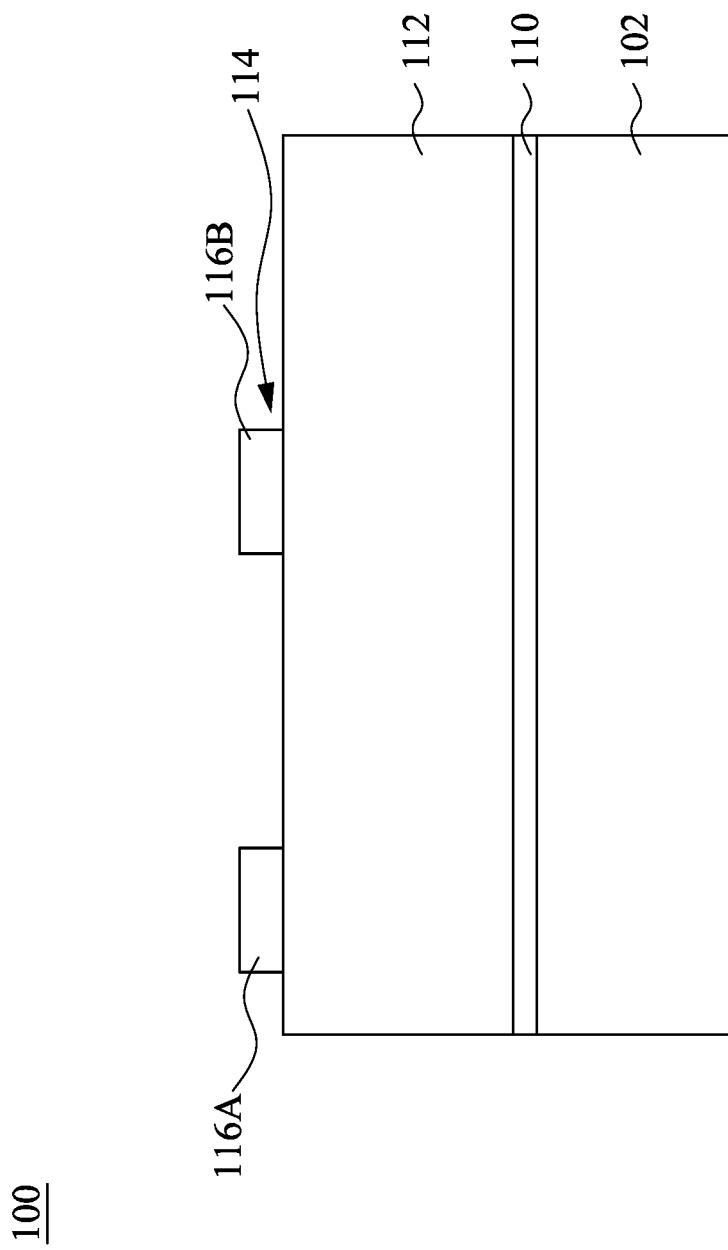
FIGS. 2-23 are cross-sectional views of a portion of a semiconductor device at various stages in a helmet layer formation process in accordance with some embodiments of the instant disclosure.
Figure 3:
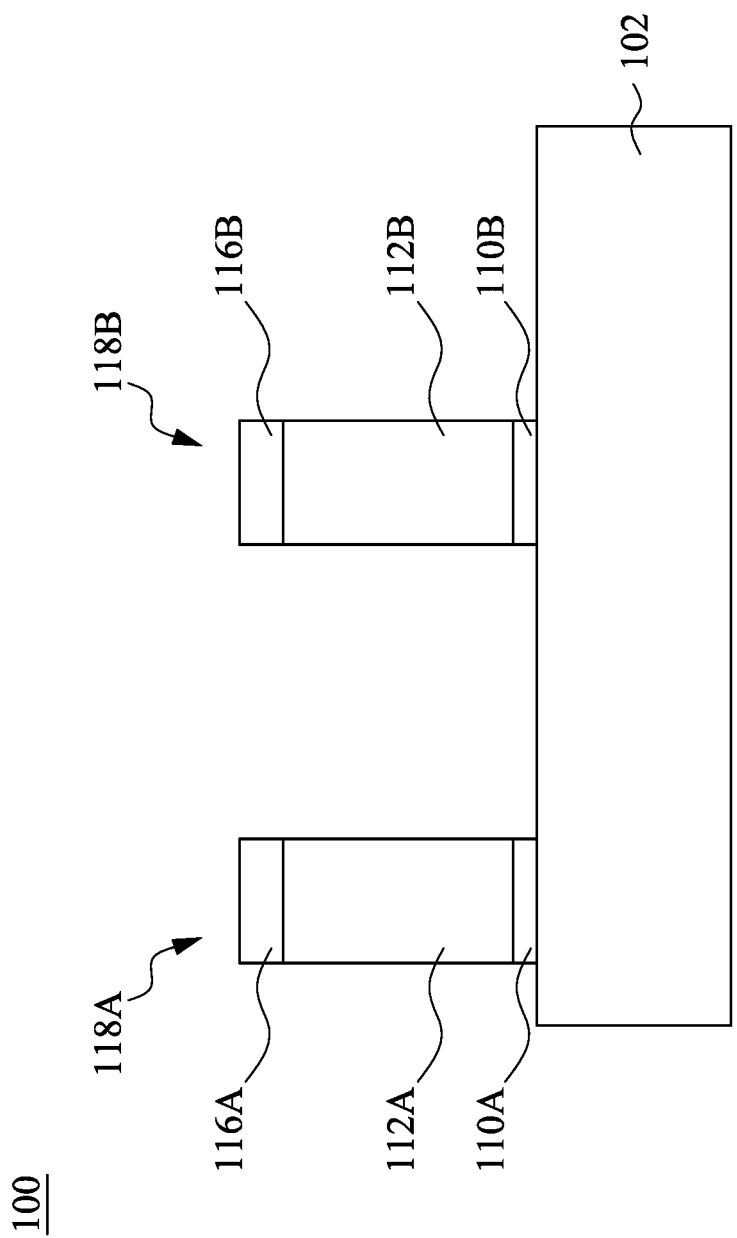
Figure 4:
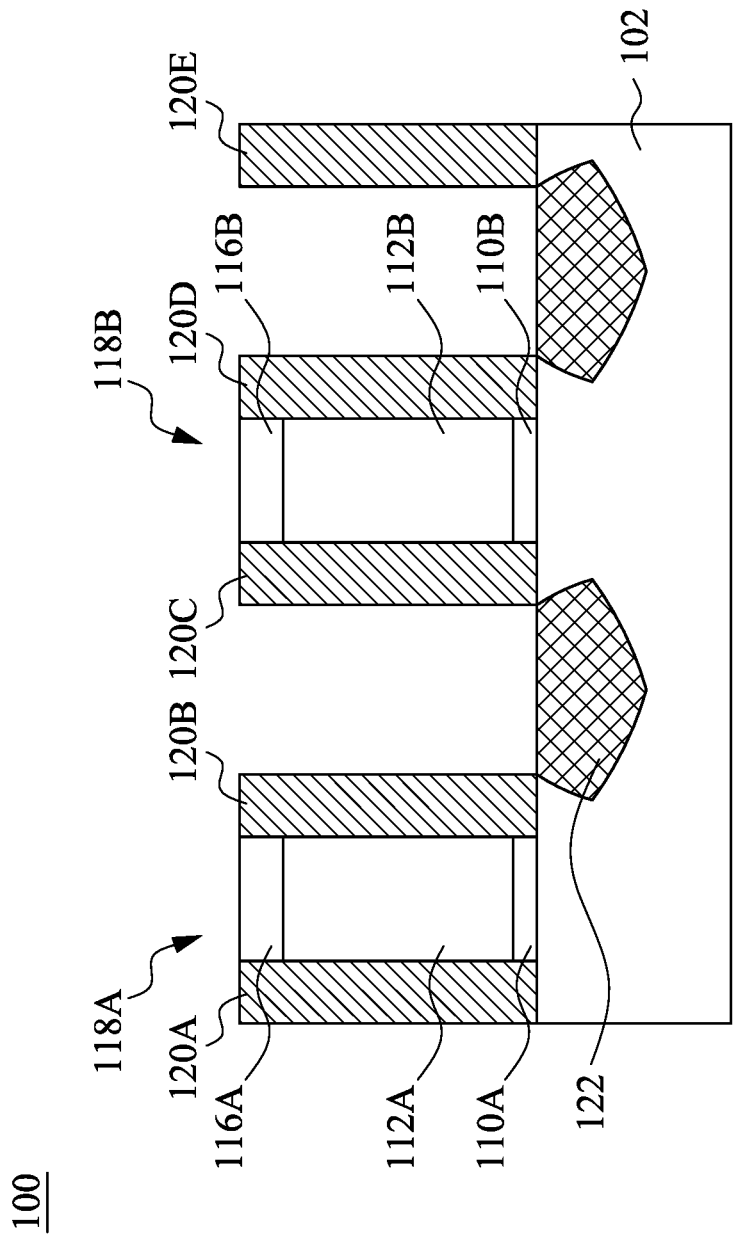
Figure 5:
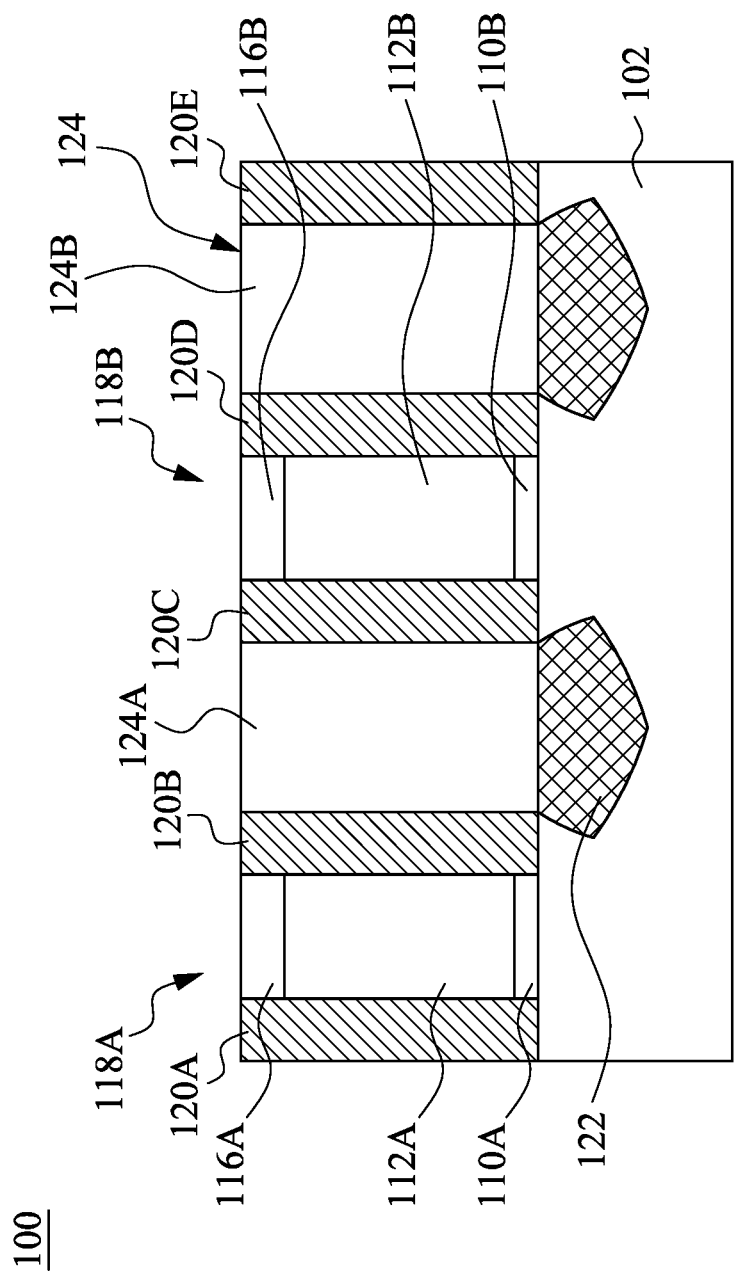
Figure 6:
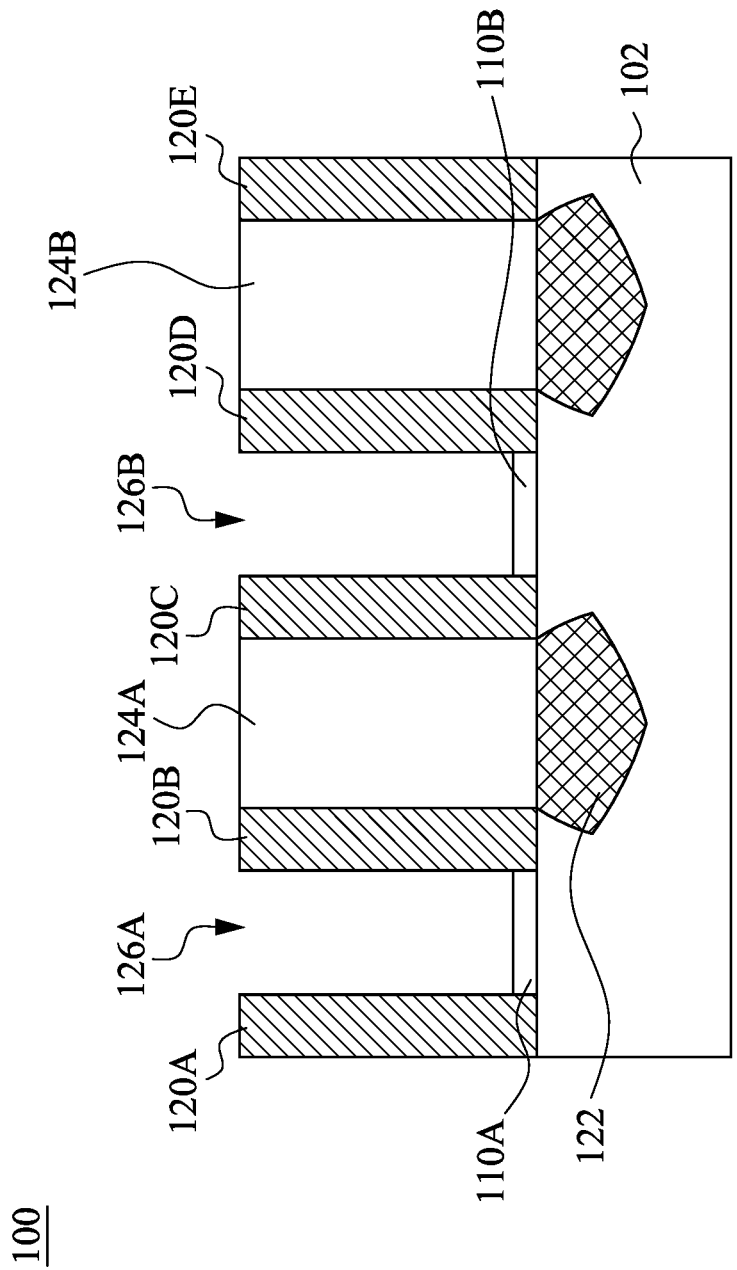
Figure 7:
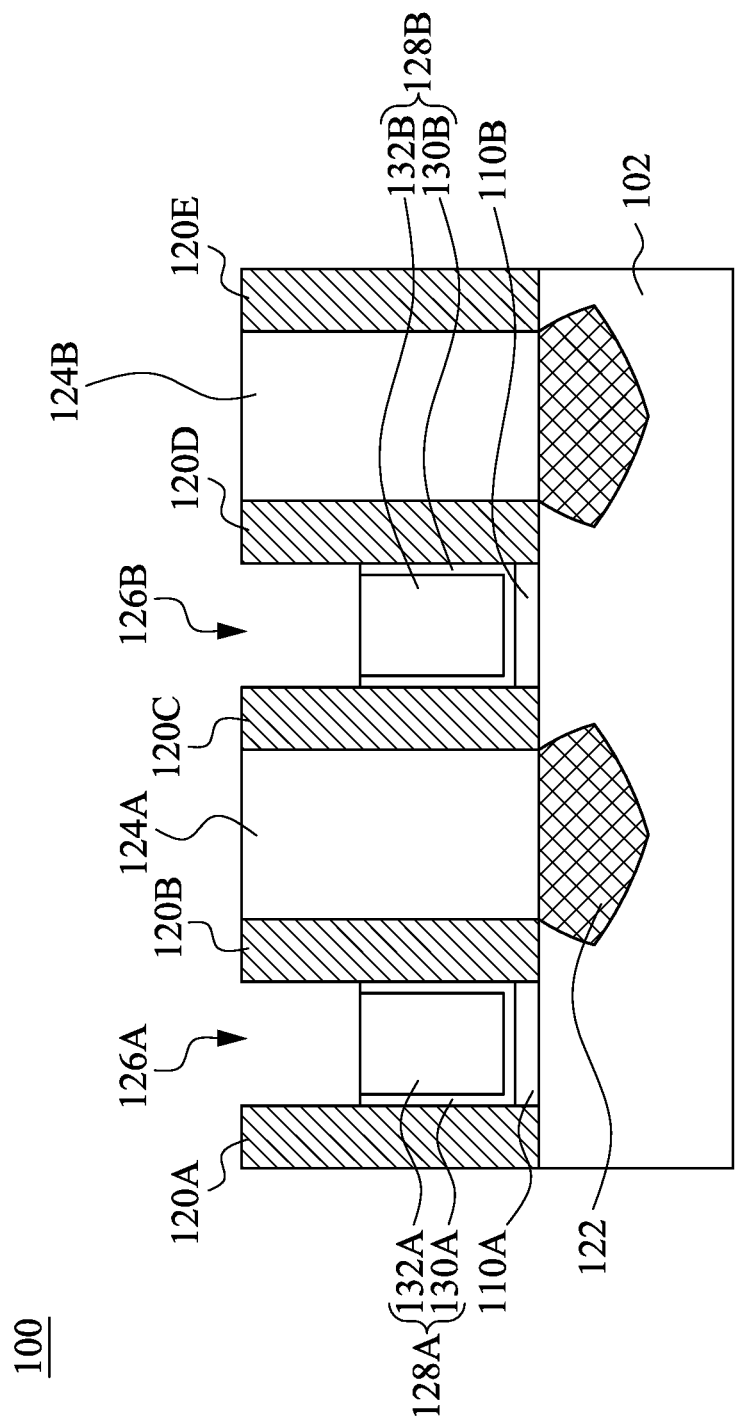
Figure 8:
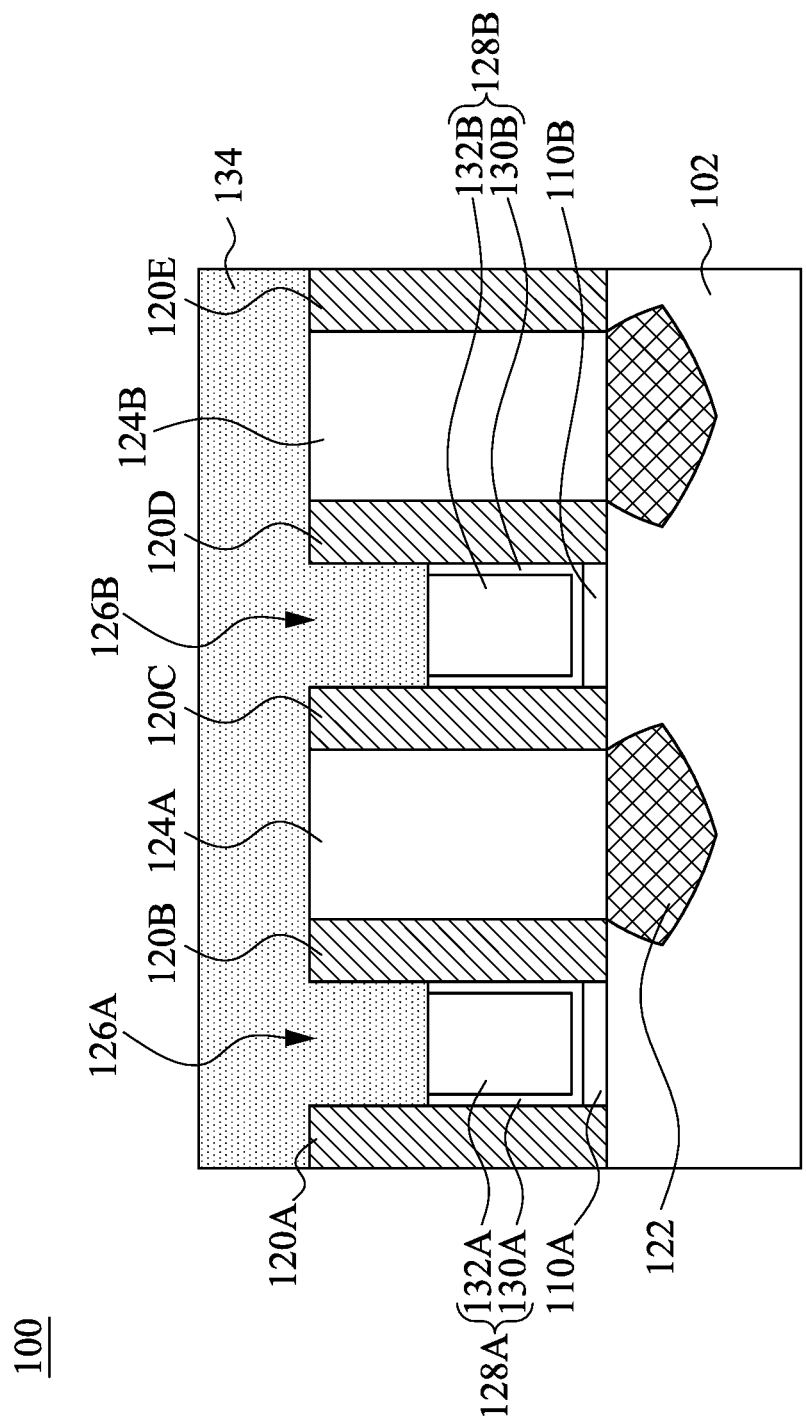
Figure 9:
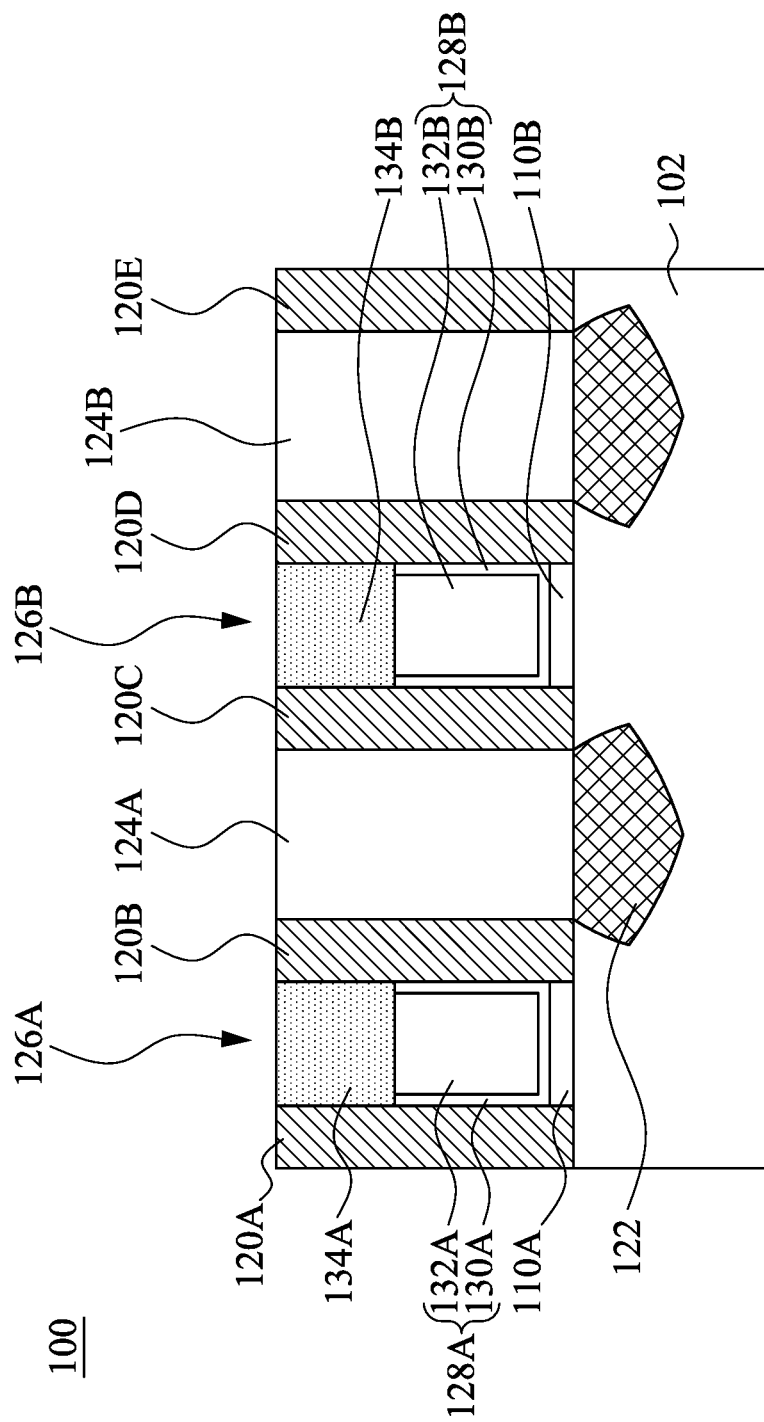
Figure 10:
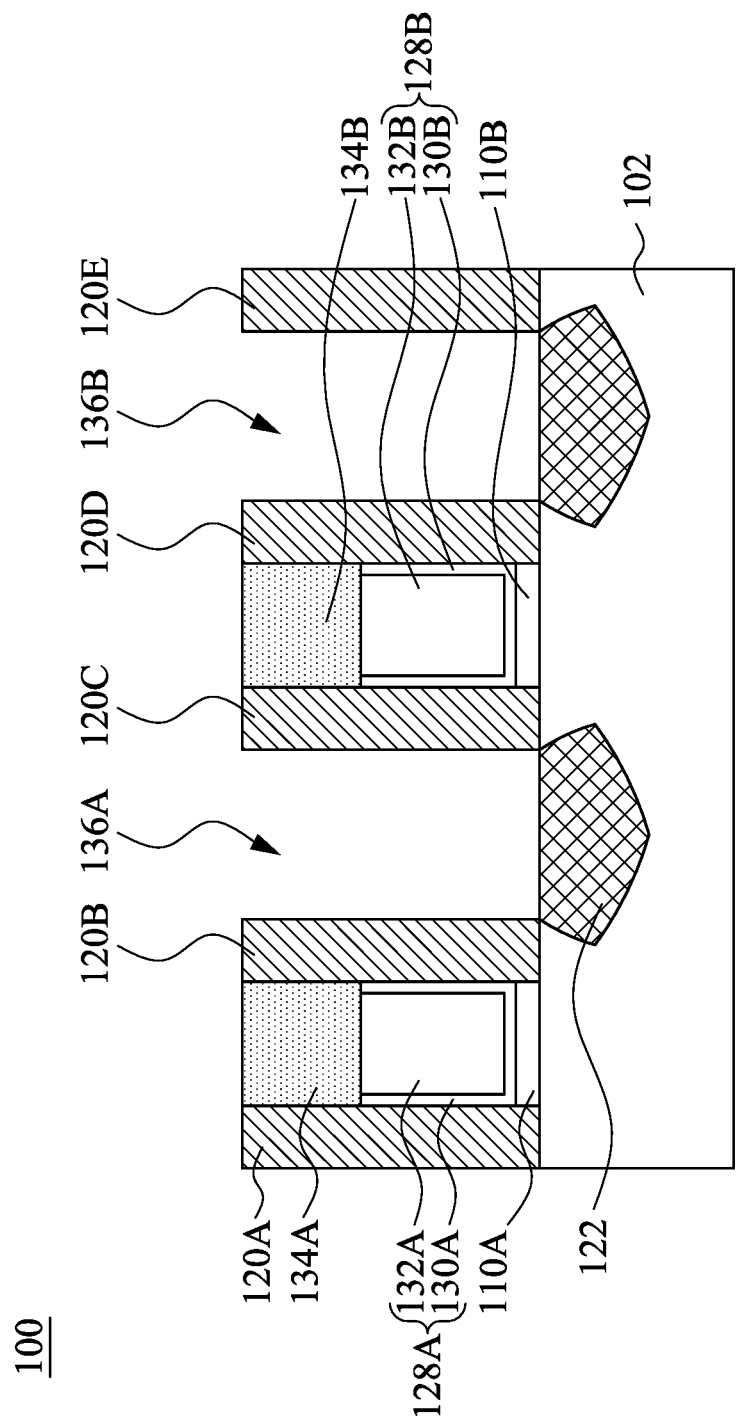
Figure 11:
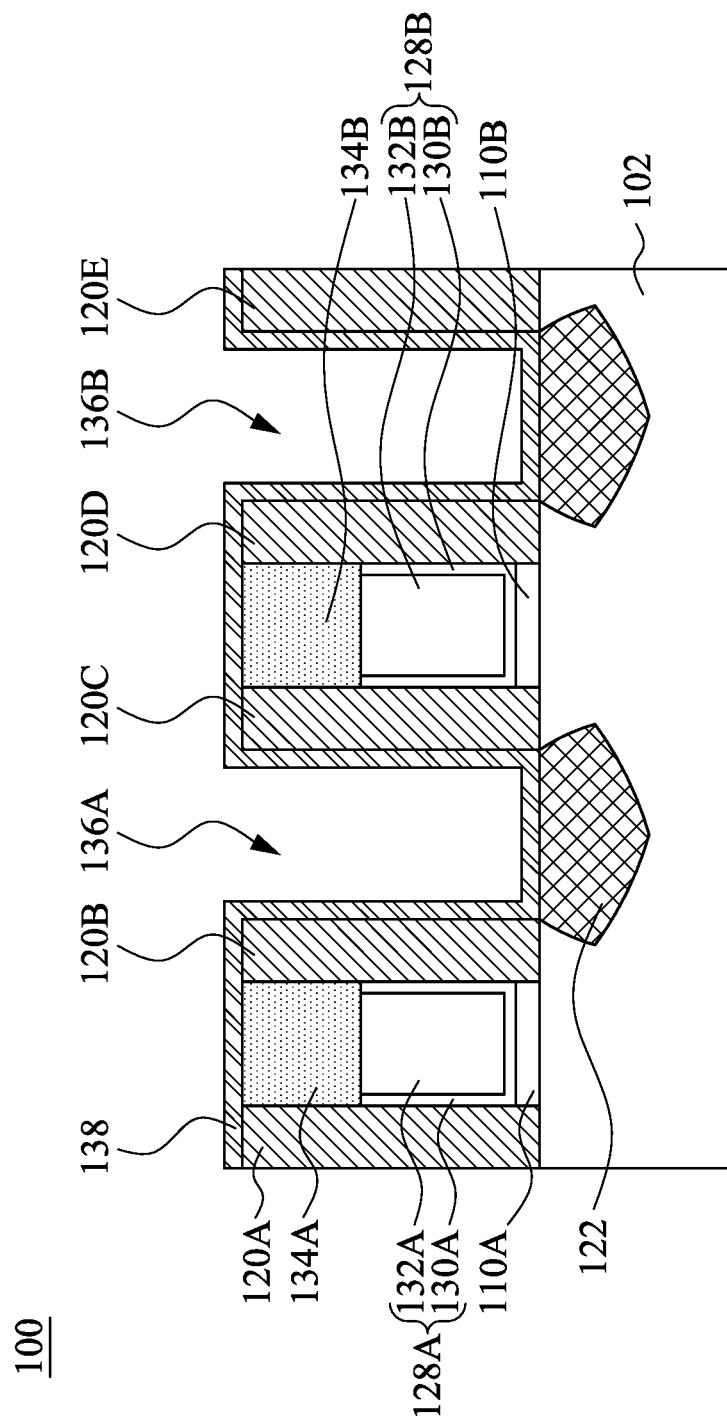
Figure 12:
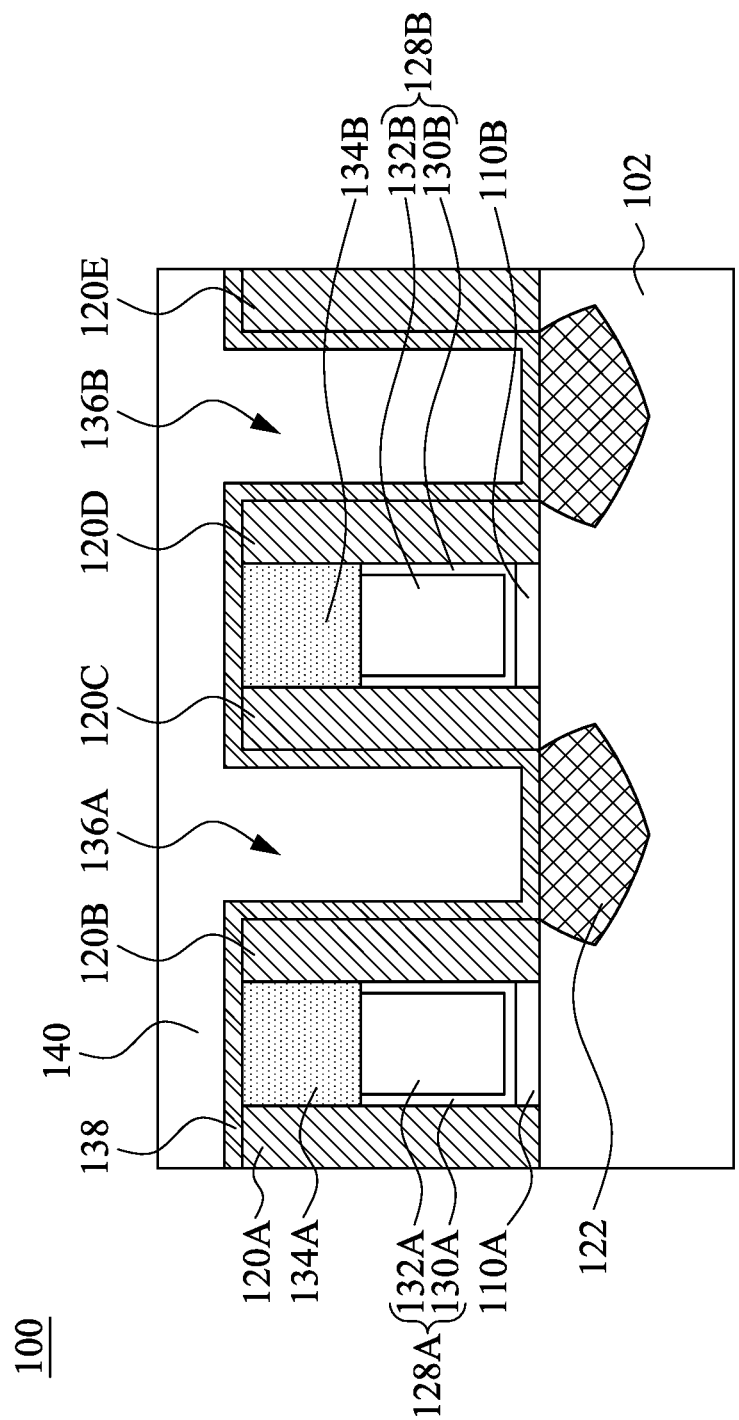
Figure 13:
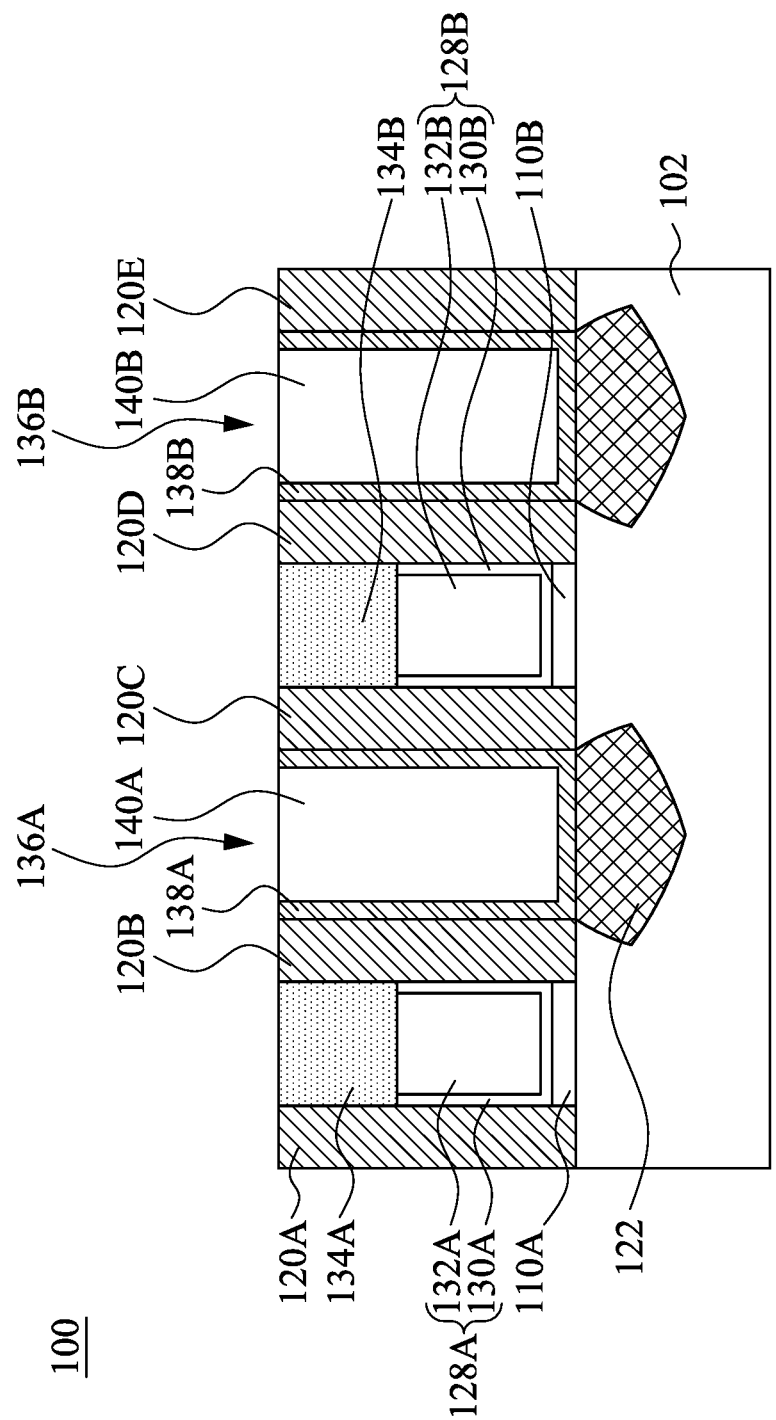
Figure 14:
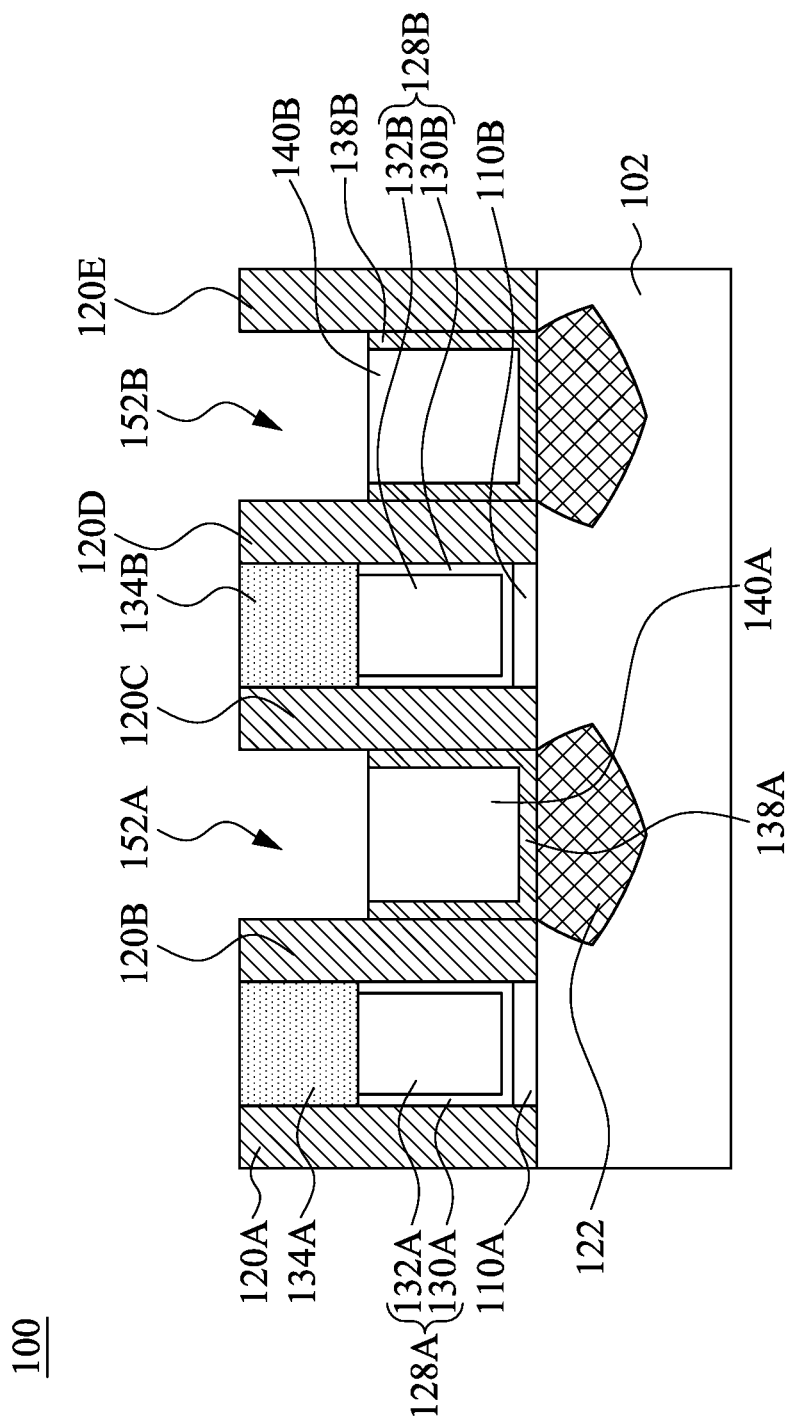
Figure 15:
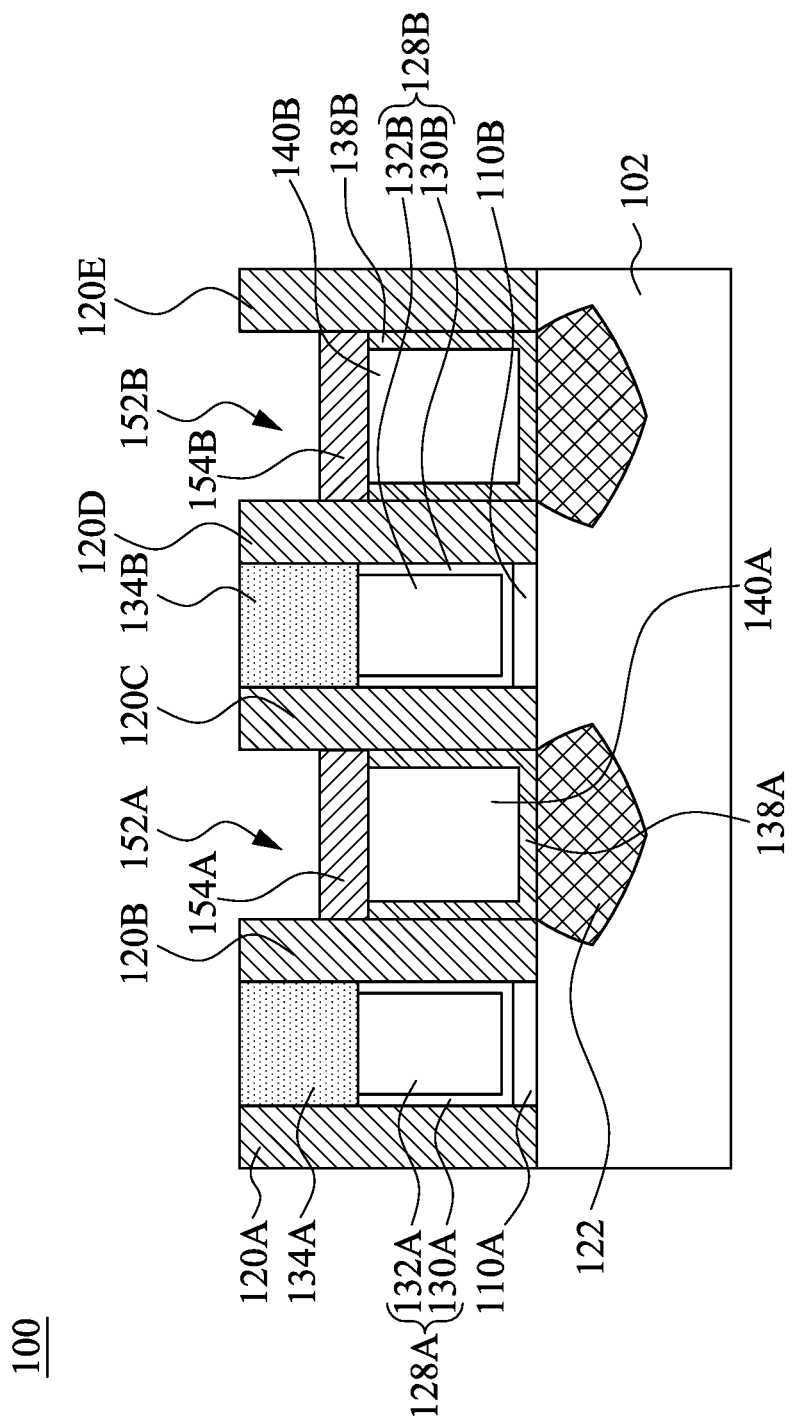
Figure 16:
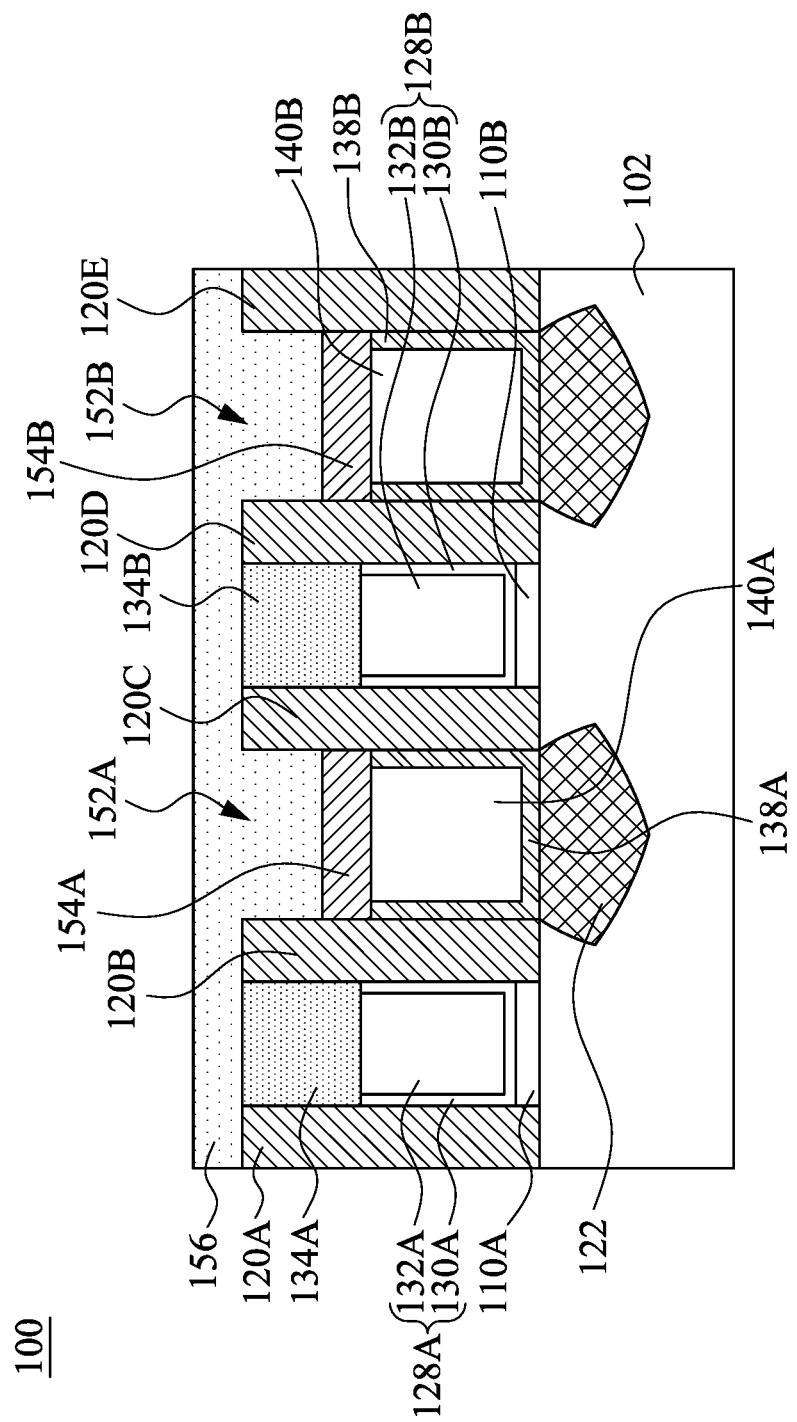
Figure 17:
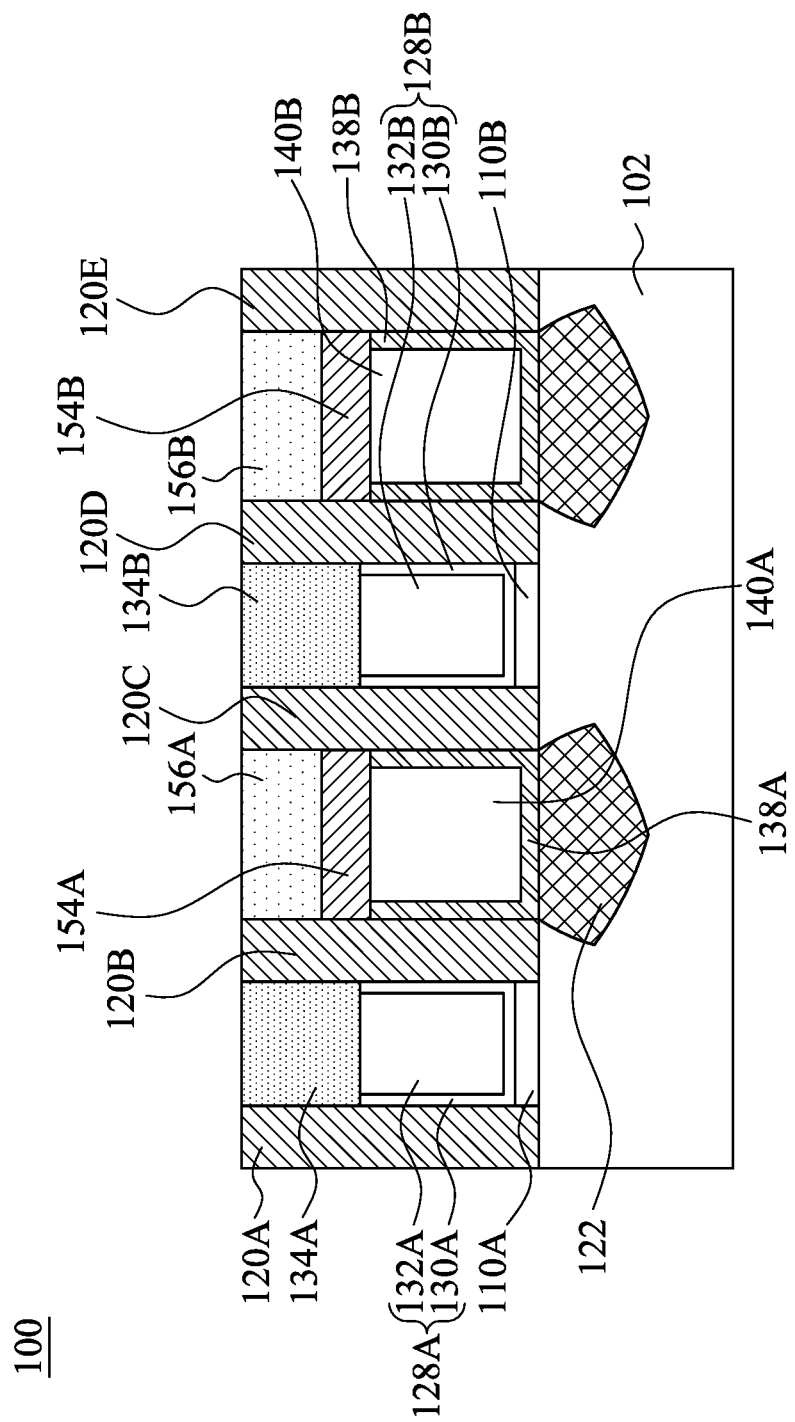
Figure 18:
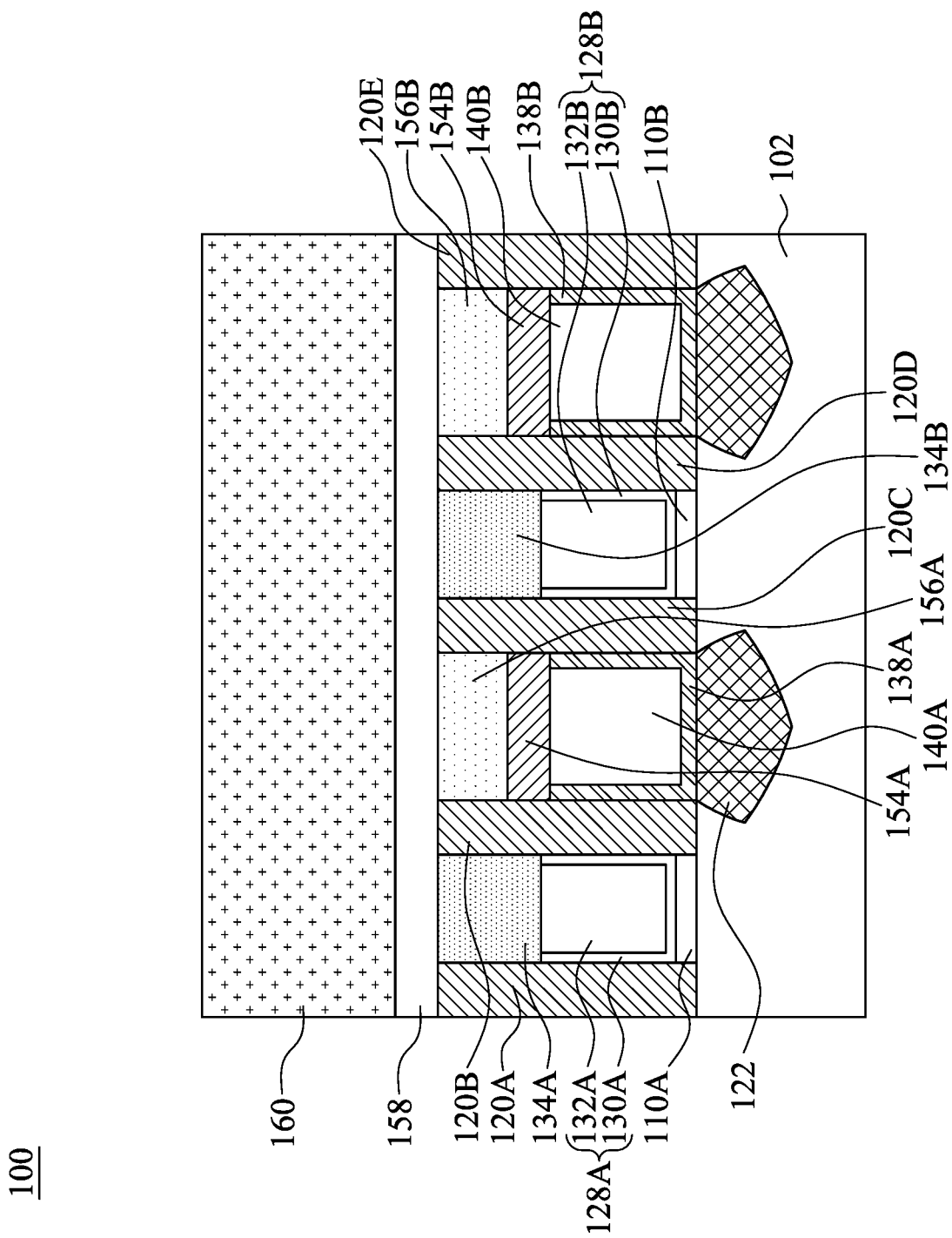
Figure 19:
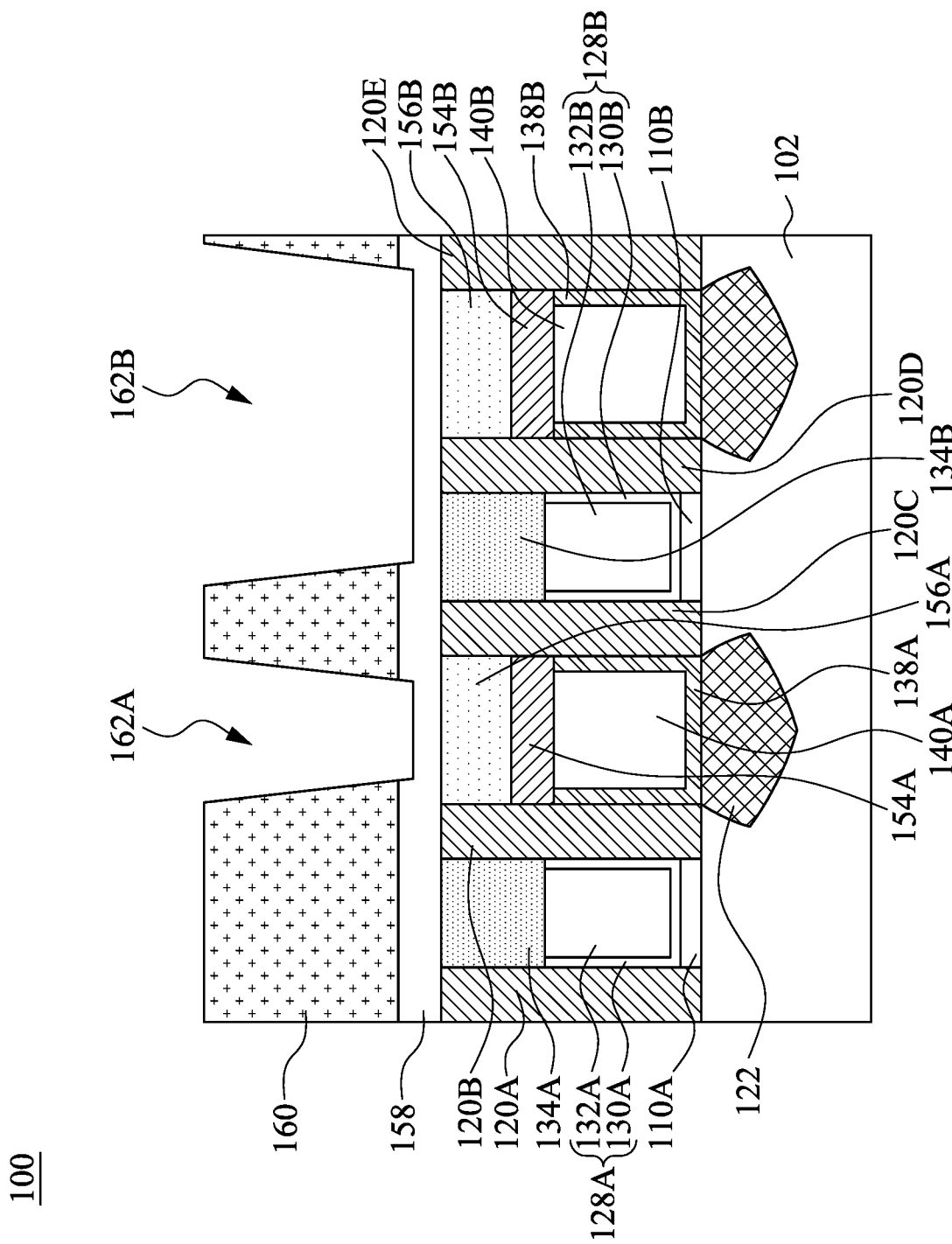
Figure 20:
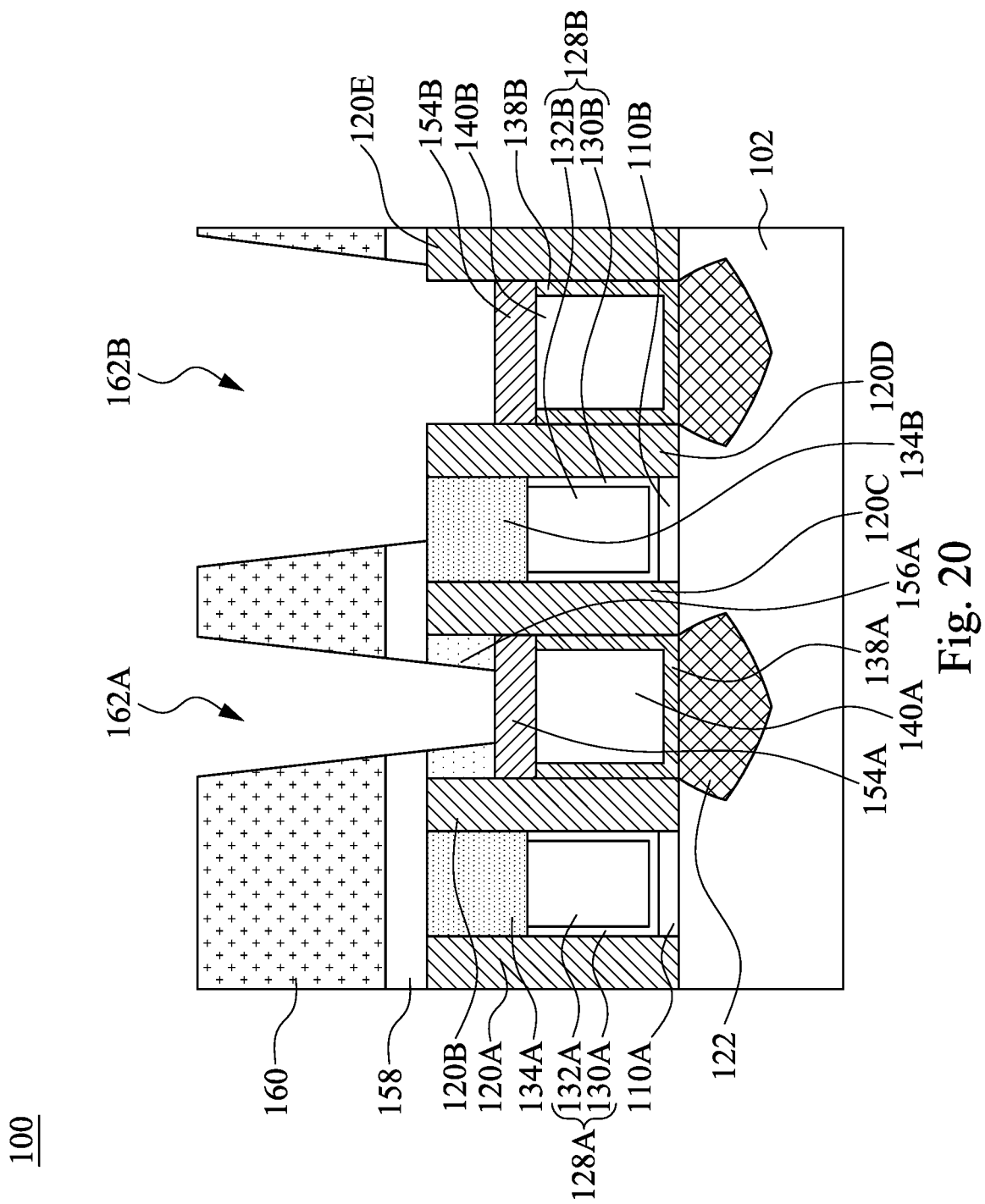
Figure 21:
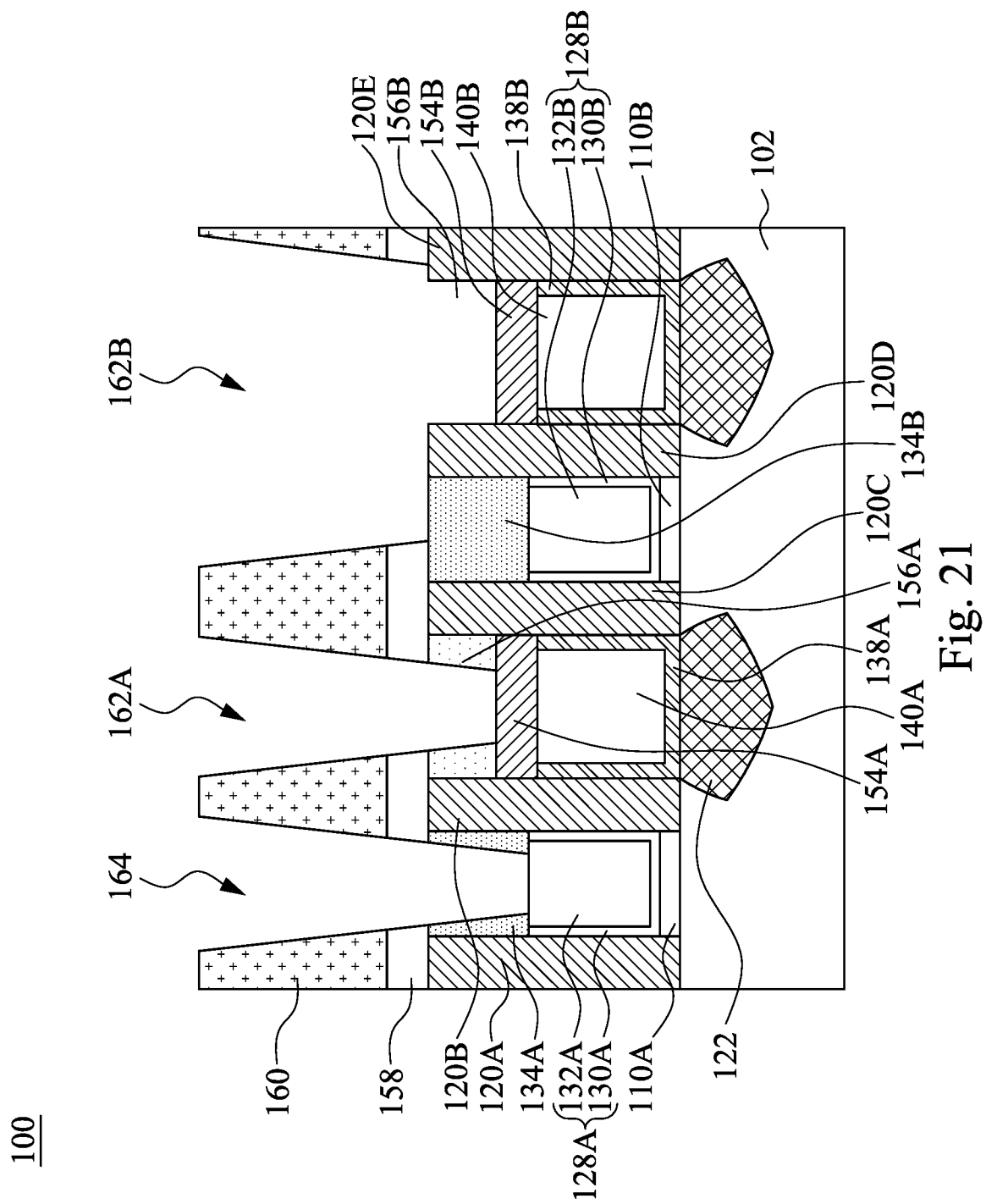
Figure 22:
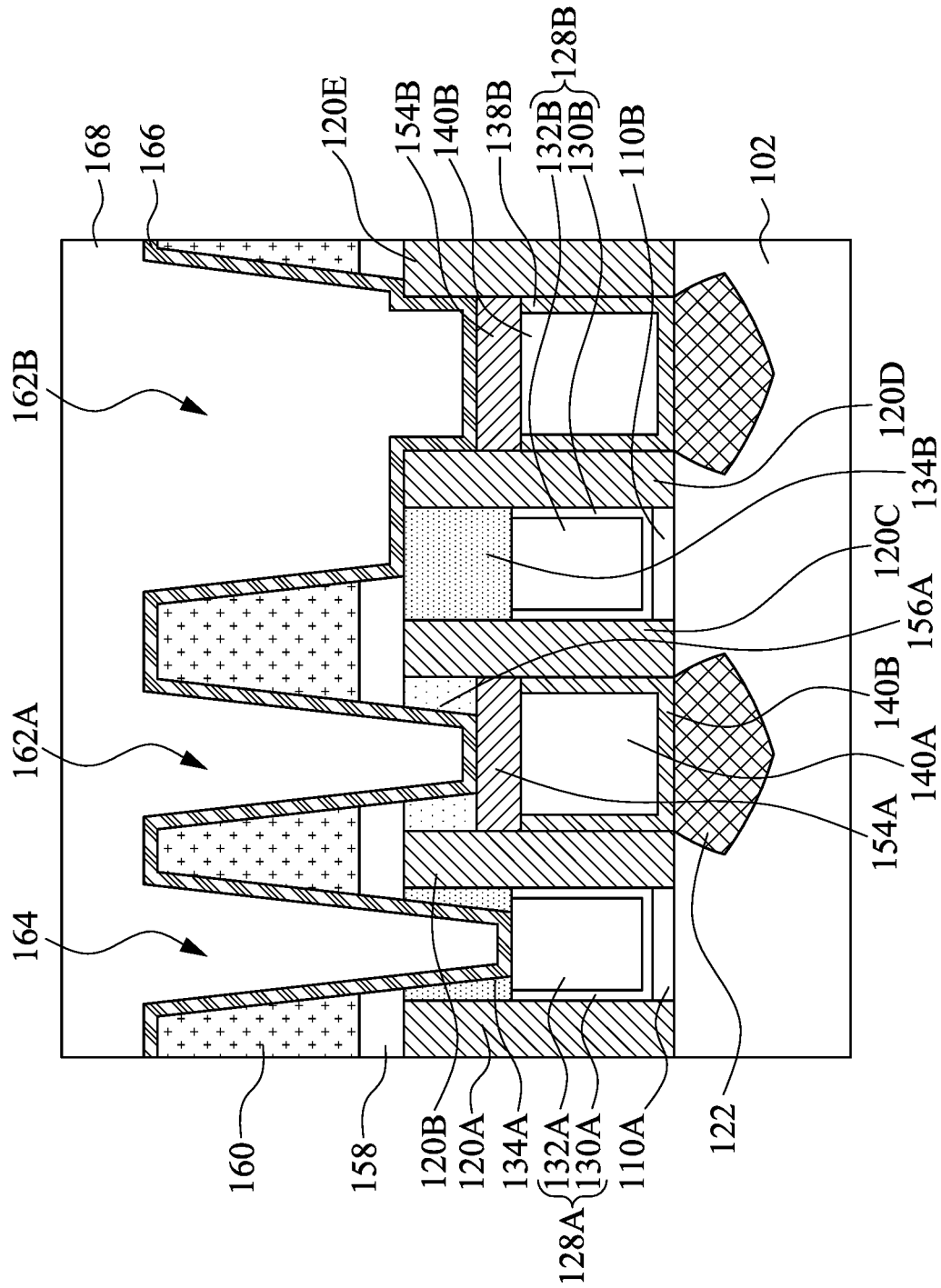
Figure 23:
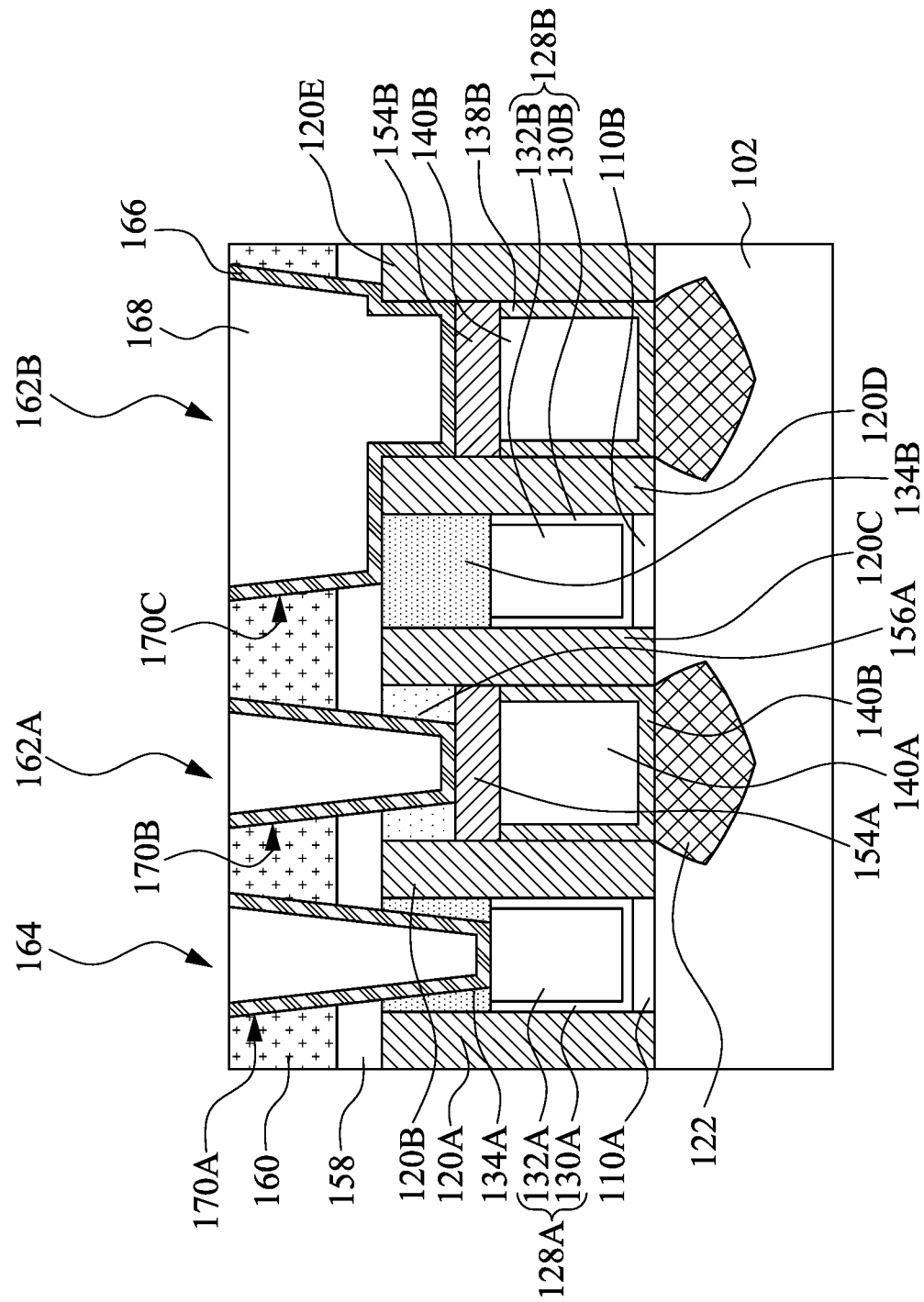

The method begins with block S102 in which a gate dielectric layer, a dummy gate layer, and a mask layer are formed over a substrate (as shown in FIG. 2). The method continues with block S104 in which an etching process is performed to pattern the gate dielectric layer and the dummy gate layer (as shown in FIG. 3). The method continues with block S106 in which gate spacers are formed over the substrate (as shown in FIG. 4). The method continues with block S108 in which a first interlayer dielectric (ILD) layer is formed (as shown in FIG. 5). The method continues with block S110 in which the first and second dummy gate portions and mask portions thereon are removed to form a first recess and a second recess (as shown in FIG. 6). The method continues with block S112 in which a first gate stack and a second gate stack are formed in the first and second recesses respectively (as shown in FIG. 7). The method continues with block S114 in which a first self-aligned contact (SAC) hard mask layer is formed above the gate spacers and first ILD portions (as shown in FIG. 8). The method continues with block S116 in which a planarization process such is performed such that the first SAC hard mask layer is lowered to level with the gate spacers (as shown in FIG. 9). The method continues with block S118 in which first via openings are formed above source/drain regions (as shown in FIG. 10). The method continues with block S120 in which a first barrier layer is blanket formed over the substrate, the gate spacers, the first SAC hard mask portions (as shown in FIG. 11). The method continues with block S122 in which a first conductive layer is deposited above the first barrier layer (as shown in FIG. 12). The method continues with block S124 in which a planarization process is performed to remove the excess first conductive layer and the first barrier layer (as shown in FIG. 13). The method continues with block S126 in which an etch back process is performed to remove some portions of first barrier portions and conductive features (as shown in FIG. 14). The method continues with block S128 in which conductive caps are formed in openings (as shown in FIG. 15). The method continues with block S130 in which a second SAC hard mask layer is formed on the gate spacers (as shown in FIG. 16). The method continues with block S132 in which a planarization process is performed, so as to lower the second SAC hard mask layer to level with top surfaces of the gate spacers (as shown in FIG. 17). The method continues with block S134 in which a contact etch stop layer (CESL) and a second ILD layer are formed (as shown in FIG. 18). The method continues with block S136 in which second via openings are formed in the second ILD layer (as shown in FIG. 19). The method continues with block S138 in which an etching process is performed to remove some portions of the CESL and second SAC hard mask portions (as shown in FIG. 20). The method continues with block S140 in which a third via opening is formed above the first gate stack (as shown in FIG. 21). The method continues with block S142 in which a second barrier layer and a second conductive layer are formed over the CESL and the second ILD layer (as shown in FIG. 22). The method continues with block S144 in which a planarization process is performed to remove excess portions of the second ILD layer, the second barrier layer, and the second conductive layer (as shown in FIG. 23).

Reference is made to FIG. 2. A gate dielectric layer 110, a dummy gate layer 112, and a mask layer 114 are formed over a substrate 102. In some embodiments, the substrate 102 includes a semiconductor substrate. In some embodiments, the substrate 102 includes a bulk silicon substrate. In some embodiments, the substrate 102 may be silicon in a crystalline structure. In some embodiments, the substrate 102 may include other elementary semiconductors, such as germanium, or include a compound semiconductor, such as silicon carbide, gallium arsenide, indium arsenide, or indium phosphide. In some embodiments, the substrate 102 includes a silicon-on-insulator (SOI) substrate. The SOI substrate may be fabricated using separation by implantation of oxygen, wafer bonding, and/or other suitable methods. In some embodiments, the substrate 102 is patterned to form a fin structure extending in an elongate manner.

The dielectric layer 110 is formed over the substrate 102. In some embodiments, the substrate 102 includes a fin structure, and the dielectric layer 110 is formed around the fin structure. The dielectric layer 110 may include a material having a dielectric constant, k, of at least or equal to about 4.0. Examples of high-k dielectric material include hafnium-based materials such as $HfO_2$, HfSiO, HfSiON, HfTaO, HfTiO, HfZrO, and $HfO_2Al_2O_3$ alloy. Additional examples of high-k dielectrics include $ZrO_2$, $Ta_2O_5$, $Al_2O_3$, $Y_2O_3$, $La_2O_3$, and $SrTiO_3$. The dielectric layer 110 may be formed by using a deposition process, for example, chemical vapor deposition (CVD), physical vapor deposition (PVD), atomic layer deposition (ALD), sputter deposition, or other techniques suitable for depositing materials.

The dummy gate layer 112 is formed over the gate dielectric layer 110. In some embodiments, the dummy gate layer 112 may include polycrystalline-silicon (poly-Si), poly-crystalline silicon-germanium (poly-SiGe), metallic nitrides, metallic silicides, metallic oxides, or metals. In some embodiments, the dummy gate layer 112 includes a metal-containing material such as TiN, TaN, TaC, Co, Ru, Al, combinations thereof, or multi-layers thereof. The dummy gate layer 112 may be formed by using a deposition process, for example, CVD, PVD, ALD, sputter deposition, or other techniques suitable for depositing materials.

The mask layer 114 is formed over the dummy gate layer 112 and then patterned to form mask portions 116A and 116B. The mask portions 116A and 116B can protect underlying portions of the dummy gate layer 112 and the gate dielectric layer 110 against subsequent etching processes. The patterned mask layer 114 may be formed by a series of operations including deposition, photolithography patterning, and etching processes. The photolithography patterning process may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Reference is made to FIG. 3. An etching process is performed to pattern the gate dielectric layer 110 and the dummy gate layer 112, thereby forming a first dummy gate structure 118A and a second dummy gate structure 118B. In some embodiments, the etching process may include dry etching. During the etching process, the mask portions 116A and 116B serve as etching masks, such that the gate dielectric layer 110 and the dummy gate layer 112 (see FIG. 2) are etched according to the patterns of mask portions 116A and 116B. After the etching process, the first and second dummy gate structures 118A and 118B formed over the substrate 102 are elongated bars crossing the fin structure of the substrate 102 in substantially perpendicular manner. The first and second dummy gate structures 118A and 118B can be referred to as gate electrodes having longitudinal directions parallel to each other. The first and second dummy gate structures 118A and 118B can define at least one channel region of the fin structure of the substrate 102. After the etching process, some portions of the gate dielectric layer 110 and the dummy gate layer 112 (see FIG. 2) remain, such as a first gate dielectric portion 110A, a second gate dielectric portion 110B, a first dummy gate portion 112A, and a second dummy gate portion 112B. Furthermore, the first gate dielectric portion 110A and the first dummy gate portion 112A may be collectively referred to as the first dummy gate structure 118A, and the second gate dielectric portion 110B and the second dummy gate portion 112B may be collectively referred to as the second dummy gate structure 118B.

Reference is made to FIG. 4. Gate spacers 120A, 120B, 120C, 120D, and 120E are formed over the substrate 102. The gate spacers 120A and 120B are around the first dummy gate structure 118A, and the gate spacers 120C and 120D are around the second dummy gate structure 118B. In some embodiments, a spacer material is deposited over the substrate 102 and then the spacer material is etched back, and selected portions as the gate spacers 120A-120E remain after the etch back. For example, the first dummy gate structure 118A is sandwiched between the gate spacers 120A and 120B, and the second dummy gate structure 118B is sandwiched between the gate spacers 120A and 120B. Furthermore, in some embodiments, in prior to the formation of the gate spacers 120A-120E, an ion implantation process may be performed to form lightly doped drain (LDD) regions in the substrate 102. During the ion implantation process for forming the LDD regions, the first and second dummy gate structures 118A and 118B can serve as masks to help control the implant profile and distribution.

In some embodiments, the spacer material includes SiOC, SiCN, or a combination thereof. In some embodiments, the gate spacers 120A-120E are made of SiOC by using a deposition process at a temperature in a range from 200° C. to 450° C. and at a pressure in a range from 1 Torr to 10 Torr, in which a silicon-containing gas, a carbon-containing gas, an oxygen-containing gas, or combinations thereof may be used in the deposition process as reacting precursors. In some embodiments, the gate spacers 120A-120E are made of SiCN by using a deposition process at a temperature in a range from 200° C. to 450° C. and at a pressure in a range from 1 Torr to 10 Torr, in which a silicon-containing gas, a carbon-containing gas, an nitrogen-containing gas, or combinations thereof may be used in the deposition process as reacting precursors.

After the formation of the gate spacers 120A-120E, source/drain (S/D) regions 122 are formed in the substrate 102. The S/D regions 122 in the substrate 102 are laterally spaced from sides of at least one of the first and second dummy gate structures 118A and 118B (i.e. adjacent the regions of the substrate 102 underlying the first and second dummy gate structures 118A and 118B). In some embodiments, the S/D regions 122 are formed by using an ion implantation. For example, an n-type dopant, such as phosphorous, or a p-type dopant, such as boron is doped into at least one portion of the substrate 102 which is not covered by the first and second dummy gate structures 118A and 118B and the gate spacers 120A-120E, so as to form the S/D regions 122.

Reference is made to FIG. 5. A first ILD layer 124 is formed. The first ILD layer 124 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or combinations thereof. It is understood that the first ILD layer 124 may comprise one or more dielectric materials and/or one or more dielectric layers. In some embodiments, the first ILD layer 124 may be deposited to a suitable thickness by CVD, high density plasma (HDP) CVD, sub-atmospheric CVD (SACVD), spin-on, sputtering, or other suitable methods. After the formation of the first ILD layer 124, the first ILD layer 124 may adhere to the gate spacers 120A-120E and be over the top of the mask portions 116A and 116B. Then, a planarization process such as chemical mechanical polish (CMP) is performed to remove the excess first ILD layer 124. In some embodiments, the planarization process stops when the mask portions 116A and 116B are exposed. In such embodiments, the mask portions 116A and 116B may serve as the CMP stop layer in the planarization process. After the planarization process, some portions of the first ILD layer 124 remain. For example, first ILD portions 124A and 124B remain. The first ILD portion 124A is between the gate spacers 120B and 120C, and the first ILD portion 124B is between the gate spacers 120D and 120E. Furthermore, the gate spacers 120A-120E and the first ILD portions 124A and 124B may have approximately the same height.

Reference is made to FIG. 6. The first and second dummy gate portions 112A and 112B and the mask portions 116A and 116B thereon (see FIG. 5) are removed to form recesses 126A and 126B. The first and second dummy gate portions 112A and 112B (see FIG. 5) are removed by using an etching process including wet etch and dry etch. In some embodiments, a hard mask is patterned over the fin structure of the substrate 102 to protect the first ILD portions 124A and 124B and the gate spacers 120A-120E. Accordingly, after the etching process, the recesses 126A and 126B are formed, in which the recess 126A is formed between the gate spacers 120A and 120B and the recess 126B is formed between the gate spacers 120C and 120D. In some embodiments, the etch operations regarding the first and second dummy gate portions 112A and 112B (see FIG. 5) may stop at the first and second gate dielectric portions 110A and 110B (see FIG. 5). In some embodiments, the first and second gate dielectric portions 110A and 110B (see FIG. 5) may be removed along with the first and second dummy gate portions 112A and 112B (see FIG. 5).

Reference is made to FIG. 7. A first gate stack 128A and a second gate stack 128B are formed in the recesses 126A and 126B respectively. The first gate stack 128A includes a first work function material portion 130A and a first metal gate electrode 132A, and the second gate stack 128B includes a second work function material portion 130B and a second metal gate electrode 132B. In some embodiments, the first and second gate stacks 128A and 128B can be referred to as high-k metal gates.

In some embodiments, the first and second work function material portions 130A and 130B may be formed by conformally depositing a work function metal layer, and the first and second metal gate electrodes 132A and 132B may be formed by depositing a gate electrode material layer on the work function material layer. In such embodiments, the overfilled work function material layer and the gate electrode material layer are pulled back by, for example, an etch back process, to form the first and second gate stacks 128A and 128B. After the etch back process, some portions of the work function material layer and the gate electrode material layer thereon remain, such as the first and second work function material portions 130A and 130B and the first and second metal gate electrodes 132A and 132B. The first and second work function material portions 130A and 130B are respectively in the recesses 126A and 126B, and therefore the first and second gate dielectric portions 110A and 110B are respectively covered with the first and second work function material portions 130A and 130B. In addition, the first and second metal gate electrodes 132A and 132B are respectively in the recesses 126A and 126B as well.

In some embodiments, the first and second work function material portions 130A and 130B include suitable work function metals to provide suitable work functions for the first and second gate stacks 128A and 128B. In some embodiments, the first and second work function material portions 130A and 130B may include one or more n-type work function metals (N-metal) for forming an n-type transistor on the substrate 102. The n-type work function metals may exemplarily include, but are not limited to, TiAl, TiAlN, TaCN, Hf, Zr, Ti, Ta, Al, metal carbides (e.g., HfC), ZrC, TiC, AlC, aluminides, and/or other suitable materials. In some embodiments, the first and second work function material portions 130A and 130B may include one or more p-type work function metals (P-metal) for forming a p-type transistor on the substrate 102. The p-type work function metals may exemplarily include, but are not limited to, TiN, WN, W, Ru, Pd, Pt, Co, Ni, conductive metal oxides, and/or other suitable materials. In some embodiments, the first and second metal gate electrodes 132A and 132B may include W, Al, Cu, Ni, Co, Ti, Ta, TiN, TaN, nickel silicide, cobalt silicide, TaC, TaSiN, TaCN, TiAl, TiAlN, or other suitable materials.

Reference is made to FIG. 8. A first self-aligned contact (SAC) hard mask layer 134 is formed above the gate spacer 120A-120E and the first ILD portions 124A and 124B. Some portions of the first SAC hard mask layer 134 are within the recesses 126A and 126B and serve to protect the underlying components or layers, such as the first and second gate stacks 128A and 128B in subsequent processes. In some embodiments, the first SAC hard mask layer 134 includes a suitable material, for example SiO, SiN, SiC, SiON, SiOC, SiCN, SiOCN, AlO, AlON, ZrO, ZrN, A-Si (amorphous silicon), or combinations thereof, which may be deposited by using e.g., PVD, CVD, PECVD, low pressure CVD, or the like. In some embodiments, the first SAC hard mask layer 134 is made of a material different from that of the first ILD portions 124A and 124B.

In some embodiments, the first hard layer 134 is made of SiO by using a deposition process at a temperature in a range from 50° C. to 400° C. and at a pressure in a range from 1 Torr to 10 Torr, in which $SiH_4$, $N_2O$, or combinations thereof may be used in the deposition process as reacting precursors. In some embodiments, the first hard layer 134 is made of SiN by using a deposition process at a temperature in a range from 250° C. to 500° C. and at a pressure in a range from 1 Torr to 10 Torr, in which DCS, $NH_3$, or combinations thereof may be used in the deposition process as reacting precursors. In some embodiments, the first hard layer 134 is made of SiC by using a deposition process at a temperature in a range from 200° C. to 450° C. and at a pressure in a range from 1 Torr to 10 Torr, in which a silicon-containing gas, a carbon-containing gas, tetramethylsilane (TMS), or combinations thereof may be used in the deposition process as reacting precursors. In some embodiments, the first hard layer 134 is made of SiON by using a deposition process at a temperature in a range from 200° C. to 450° C. and at a pressure in a range from 1 Torr to 10 Torr, in which $SiH_4$, $N_2O$, or combinations thereof may be used in the deposition process as reacting precursors. In some embodiments, the first hard layer 134 is made of SiOC by using a deposition process at a temperature in a range from 200° C. to 450° C. and at a pressure in a range from 1 Torr to 10 Torr, in which a silicon-containing gas, a carbon-containing gas, an oxygen-containing gas, or combinations thereof may be used in the deposition process as reacting precursors. In some embodiments, the first hard layer 134 is made of SiCN by using a deposition process at a temperature in a range from 200° C. to 450° C. and at a pressure in a range from 1 Torr to 10 Torr, in which a silicon-containing gas, a carbon-containing gas, a nitrogen-containing gas, or combinations thereof may be used in the deposition process as reacting precursors. In some embodiments, the first hard layer 134 is made of SiOCN by using a deposition process at a temperature in a range from 200° C. to 450° C. and at a pressure in a range from 1 Torr to 10 Torr, in which a silicon-containing gas, a carbon-containing gas, an oxygen-containing gas, a nitrogen-containing gas, or combinations thereof may be used in the deposition process as reacting precursors. In some embodiments, the first hard layer 134 is made of AlO or AlON by using a deposition process at a temperature in a range from 200° C. to 400° C. and at a pressure in a range from 1 Torr to 10 Torr, in which trimethylaluminum (TMA), $H_2O$, or combinations thereof may be used in the deposition process as reacting precursors. In some embodiments, the first hard layer 134 is made of ZrO/ZrN by using a deposition process at a temperature in a range from 200° C. to 400° C. and at a pressure in a range from 1 Torr to 10 Torr, in which $ZrCl_4$, $H_2O$, or combinations thereof may be used in the deposition process as reacting precursors. In some embodiments, the first hard layer 134 is made of A-Si by using a deposition process at a temperature in a range from 350° C. to 530° C. and at a pressure under 1 Torr, in which $SiH_4$, $Si_2H_6$, or combinations thereof may be used in the deposition process as reacting precursors.

Reference is made to FIG. 9. A planarization process such as CMP is performed such that the first SAC hard mask layer 134 is lowered to level with the gate spacers 120A-120E. After the planarization process, the portions of the first SAC hard mask layer 134 within the recesses 126A and 126B remain, such as the first SAC hard mask portions 134A and 134B. The first SAC hard mask portion 134A is within the recesses 126A and above the first gate stack 128A, and the first SAC hard mask portion 134B is within the recesses 126B and above the second gate stack 128B. The first SAC hard mask portions 134A and 134B can serve to protect the first and second gate stacks 128A and 128B in subsequent processes. In some embodiments, the first SAC hard mask portions 134A and 134B have the same thickness in a range from 5 nm to 50 nm. The first SAC hard mask portions 134A and 134B serve to protect the underlying components or layers like the first and second gate stacks 128A and 128B during subsequent via formation processes.

Reference is made to FIG. 10. First via openings 136A and 136B are formed above the S/D regions 122. The first via openings 136A and 136B are formed by removing the first ILD portions 124A and 124B (see FIG. 9). In some embodiments, The first ILD portions 124A and 124B (see FIG. 9) may be removed by using an etch back process. In some embodiments, the etch back process may be a selectively etching process. During the selectively etching process, since the etch back process may be a selectively etching process, where the etchant(s) selectively remove the first ILD portions 124A and 124B (see FIG. 9) while keep the first SAC hard mask portions 134A and 134B substantially intact. Accordingly, after the removal of the first ILD portions 124A and 124B (see FIG. 9), the first via openings 136A and 136B are formed to expose the underlying S/D regions 122 in the fin structure of the substrate 102.

Reference is made to FIG. 11. A first barrier layer 138 is blanket formed over the substrate 102, the gate spacers 120A-120E, and the first SAC hard mask portions 134A and 134B. Some portions of the first barrier layer 138 are within the first via openings 136A and 136B, in which these portions of the first barrier layer 138 may be in contact with a sidewall of at least one of the gate spacers 120A-120E and the S/D regions 122 in the fin structure of the substrate 102. In some embodiments, the first barrier layer 138 is a metal or metal alloy layer. The first barrier layer 138 may include Co, Ag, Al, Zn, Ca, Au, Mg, W, Mo, Ni, Cr, or the like, which may be deposited by using e.g., PVD, CVD, PECVD, LPCVD, or the like.

Reference is made to FIG. 12. A first conductive layer 140 is deposited above the first barrier layer 138. The first via openings 136A and 136B formed after the removal of the first ILD portions 124A and 124B (see FIG. 9) are filled by the first conductive layer 140. The first conductive layer 140 is wrapped around in the pocket lined by the first barrier layer 138. The first conductive layer 140 includes electrically conductive materials and provides electrical connection to the S/D regions 122. For example, the first conductive layer 140 includes Co, Ru, or combinations thereof. In some embodiments, the first conductive layer 140 is made of Co by using a deposition process at a temperature in a range from 300° C. to 400° C. and at a pressure in a range from 1 Torr to 10 Torr.

Reference is made to FIG. 13. A planarization process such as CMP is performed to remove the excess first conductive layer 140 and the first barrier layer 138. By the planarization process, top surfaces of the first conductive layer 140 and the first barrier layer 138 are level with top surfaces of the gate spacers 120A-120E and the first SAC hard mask portions 134A and 134B. After the planarization process, some portions of the first barrier layer 138 and the first conductive layer 140 remain, such as the first barrier portions 138A and 138B and the conductive features 140A and 140B. The first barrier portion 138A and the conductive feature 140A are within the first via opening 136A, and the first barrier portion 138B and the conductive feature 140B are within the first via opening 136B. In some embodiments, the conductive features 140A and 140B can be configured to electrically communicate lateral components on the substrate 102.

Reference is made to FIG. 14. An etch back process is performed to remove some portions of the first barrier portions 138A and 138B and the conductive features 140A and 140B. Top surfaces of the first barrier portions 138A and 138B and the conductive features 140A and 140B are brought down. After the etch back process, the height of at least one of the first barrier portions 138A and 138B is lower than bottoms of first SAC hard mask portions 134A and 134B, and the height of at least one of the conductive features 140A and 140B is lower than the bottoms of first SAC hard mask portions 134A and 134B as well. The top surfaces of the first SAC hard mask portions 134A and 134B and the conductive features 140A and 140B are in a position lower than top surfaces of the first and second gate stacks 128A and 128B. In some embodiments, at least one of the conductive features 140A and 140B may have a thickness in a range from 10 nm to 30 nm. Accordingly, after the etch back process, the top surfaces of the gate spacers 120A-120E are bare and free of the first barrier portions 138A and 138B and the conductive features 140A and 140B. Furthermore, openings 152A and 152B are formed after the removal of the portions of the first barrier portions 138A and 138B and the conductive features 140A and 140B. The openings 152A and 152B are defined by the sidewalls of the gate spacers 120B-120E and the top surfaces of the first barrier portions 138A and 138B and the conductive features 140A and 140B.

Reference is made to FIG. 15. Conductive caps 154A and 154B are respectively formed in the openings 152A and 152B. Conductive caps 154A and 154B are formed using a bottom-up deposition technique, rather than a conformal deposition technique. The resulting conductive caps 154A and 154B thus resemble a substantial flat layer, rather a U-shaped layer, overlying conductive features 140A and 140B. The first barrier portion 138A and the conductive feature 140A are covered with the conductive cap 154A, and the first barrier portion 138B and the conductive feature 140B are covered with the conductive cap 154B. The conductive cap 154A has a bottom surface in contact with the first barrier portion 138A and the conductive feature 140A, and the conductive cap 154B has a bottom surface in contact with the first barrier portion 138B and the conductive feature 140B. Top surfaces of the conductive caps 154A and 154B are in a portion higher than the top surfaces of the first and second gate stacks 128A and 128B and lower than the top surfaces of the gate spacers 120A-120E. In some embodiments, the conductive caps 154A and 154B may include Co, Ru, W, or combinations thereof, which may be deposited by using e.g., PVD, CVD, PECVD, low pressure CVD, or the like. In some embodiments, the conductive caps 154A and 154B are made of W by a selective deposition process at a temperature in a range from 300° C. to 450° C. and at a pressure in a range from 1 Torr to 10 Torr, in which tungsten hexafluoride (WF), fluorine-free tungsten (FFW), or combinations thereof may be used in the selective deposition process as reacting precursors. During the selective deposition process, the conductive caps 154A and 154B tend to be formed on the conductive features 140A and 140B rather than gate spacers 120A-120E which are made of the spacer material. In some embodiments, the conductive caps 154A and 154B include a material which is different from that of the conductive features 140A and 140B. For example, the conductive features 140A and 140B are made of Co, and the conductive caps 154A and 154B are made of W. In some embodiments, at least one of the conductive caps 154A and 154B has a thickness in a ranged from 3 nm to 10 nm. In some embodiments, the conductive caps 154A and 154B are thinner than the conductive features 140A and 140B. The conductive caps 154A and 154B serves to protect the underlying components or layers like the first barrier portions 138A and 138B and the conductive features 140A and 140B.

Reference is made to FIG. 16. A second SAC hard mask layer 156 is formed on the gate spacers 120A-120E, in which some portions of the second mask layer 156 fill in the openings 152A and 152B and are above the first barrier portions 138A and 138B, the conductive features 140A and 140B, and the conductive caps 154A and 154B. The second SAC hard mask layer 156 may be spaced apart from the conductive features 140A and 140B by the conductive caps 154A and 154B. In some embodiments, the second SAC hard mask layer 156 includes a suitable material, for example SiO, SiN, SiC, SiON, SiOC, SiCN, SiOCN, AlO, AlON, ZrO, ZrN, A-Si (amorphous silicon), or combinations thereof, which may be deposited by using e.g., PVD, CVD, PECVD, low pressure CVD, or the like. In some embodiments, the second SAC hard mask layer 156 is made of a material different from those of the first SAC hard mask portions 134A and 134B. For example, when the first SAC hard mask portions 134A and 134B are made of SiOCN, the second SAC hard mask layer 156 may be made of SiN. In some embodiments, the material of the first SAC hard mask portions 134A and 134B may be the same as the second SAC hard mask layer 156.

In some embodiments, the second SAC hard mask layer 156 is made of SiO by using a deposition process at a temperature in a range from 50° C. to 400° C. and at a pressure in a range from 1 Torr to 10 Torr, in which $SiH_4$, $N_2O$, or combinations thereof may be used in the deposition process as reacting precursors. In some embodiments, the second SAC hard mask layer 156 is made of SiN by using a deposition process at a temperature in a range from 250° C. to 500° C. and at a pressure in a range from 1 Torr to 10 Torr, in which DCS, $NH_3$, or combinations thereof may be used in the deposition process as reacting precursors. In some embodiments, the second SAC hard mask layer 156 is made of SiC by using a deposition process at a temperature in a range from 200° C. to 450° C. and at a pressure in a range from 1 Torr to 10 Torr, in which a silicon-containing gas, a carbon-containing gas, tetramethylsilane (TMS), or combinations thereof may be used in the deposition process as reacting precursors. In some embodiments, the second SAC hard mask layer 156 is made of SiON by using a deposition process at a temperature in a range from 200° C. to 450° C. and at a pressure in a range from 1 Torr to 10 Torr, in which $SiH_4$, $N_2O$, or combinations thereof may be used in the deposition process as reacting precursors. In some embodiments, the second SAC hard mask layer 156 is made of SiOC by using a deposition process at a temperature in a range from 200° C. to 450° C. and at a pressure in a range from 1 Torr to 10 Torr, in which a silicon-containing gas, a carbon-containing gas, an oxygen-containing gas, or combinations thereof may be used in the deposition process as reacting precursors. In some embodiments, the second SAC hard mask layer 156 is made of SiCN by using a deposition process at a temperature in a range from 200° C. to 450° C. and at a pressure in a range from 1 Torr to 10 Torr, in which a silicon-containing gas, a carbon-containing gas, a nitrogen-containing gas, or combinations thereof may be used in the deposition process as reacting precursors. In some embodiments, the second SAC hard mask layer 156 is made of SiOCN by using a deposition process at a temperature in a range from 200° C. to 450° C. and at a pressure in a range from 1 Torr to 10 Torr, in which a silicon-containing gas, a carbon-containing gas, an oxygen-containing gas, a nitrogen-containing gas, or combinations thereof may be used in the deposition process as reacting precursors. In some embodiments, the second SAC hard mask layer 156 is made of AlO or AlON by using a deposition process at a temperature in a range from 200° C. to 400° C. and at a pressure in a range from 1 Torr to 10 Torr, in which trimethylaluminum (TMA), $H_2O$, or combinations thereof may be used in the deposition process as reacting precursors. In some embodiments, the second SAC hard mask layer 156 is made of ZrO/ZrN by using a deposition process at a temperature in a range from 200° C. to 400° C. and at a pressure in a range from 1 Torr to 10 Torr, in which $ZrCl_4$, $H_2O$, or combinations thereof may be used in the deposition process as reacting precursors. In some embodiments, the second SAC hard mask layer 156 is made of A-Si by using a deposition process at a temperature in a range from 350° C. to 530° C. and at a pressure under 1 Torr, in which $SiH_4$, $Si_2H_6$, or combinations thereof may be used in the deposition process as reacting precursors.

Reference is made to FIG. 17. A planarization process such as CMP is performed, so as to lower the second SAC hard mask layer 156 (see FIG. 16) to level with the top surfaces of the gate spacers 120A-120E. After the planarization process, some portions of the second SAC hard mask layer 156 remain, such as the second SAC hard mask portions 156A and 156B. Top surfaces of the second SAC hard mask portions 156A and 156B are level with the top surfaces of the gate spacers 120A-120E and the first SAC hard mask portions 134A and 134B. In some embodiments, the second SAC hard mask portions 156A and 156B have the same thickness in a range from 5 nm to 50 nm. In some embodiments, the second SAC hard mask portions 156A and 156B have the same thickness which is different from those of the first SAC hard mask portions 134A and 134B. For example, the second SAC hard mask portions 156A and 156B are thinner than the first SAC hard mask portions 134A and 134B. Furthermore, a distance from the top surface of the second SAC hard mask portion 156A to a bottom surface of the first barrier portion 138A which is in contact with the substrate 102 is substantially equal to the height of at least one of the gate spacers 120A-120E. The second SAC hard mask portions 156A and 156B serve to protect the underlying components or layers like the conductive caps 154A and 154B during subsequent via formation processes.

Reference is made to FIG. 18. A contact etch stop layer (CESL) 158 and a second ILD layer 160 are formed. The CESL 158 is formed on the gate spacers 120A-120E, the first SAC hard mask portions 134A and 134B, and the second SAC hard mask portions 156A and 156B. The second ILD layer 160 is formed above the CESL 158. In some embodiments, the CESL 158 serve as a metal contact etch stop layer.

In some embodiments, the CESL 158 includes a suitable material, for example SiO, SiN, SiC, SiON, SiOC, SiCN, SiOCN, AlO, AlON, ZrO, ZrN, A-Si (amorphous silicon), or combinations thereof, which may be deposited by using e.g., PVD, CVD, PECVD, low pressure CVD, or the like. In some embodiments, the material of the second SAC hard mask portions 156A and 156B and the CESL 158 may be the same. For example, when the second SAC hard mask portions 156A and 156B are made of SiN, the CESL 158 is made of SiN as well. In such embodiments, the material of the second SAC hard mask portions 156A and 156B and the CESL 158 may be the same and is different from the material of the first SAC hard mask portions 134A and 134B. Furthermore, the CESL 158 may have a thickness in a range from 5 nm to 50 nm.

In some embodiments, the second ILD layer 160 includes a suitable material, for example tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), combinations thereof, or other suitable dielectric materials. In some embodiments, the second ILD layer 160 includes a suitable material, for example SiO, SiN, SiC, SiON, SiOC, SiCN, SiOCN, AlO, AlON, ZrO, ZrN, A-Si (amorphous silicon), or combinations thereof. In some embodiments, the material of the second ILD layer 160 is different from that of the CESL 158. The second ILD layer 160 may formed by using PVD, CVD, PECVD, low pressure CVD, or other suitable deposition technique.

Reference is made to FIG. 19. Second via openings 162A and 162B are formed in the second ILD layer 160 by any suitable process. For example, the formation of the second via openings 162A and 162B may include patterning the second ILD layer 160 by photolithography and etching processes, in which the etching process may be performed by using a dry etching, wet etching, and/or plasma etching process, so as to remove some portions of the second ILD layer 160. During the etching process, since the etching process of the second ILD layer 160 may be a selectively etching process, where the etchant(s) selectively remove the some portions of the second ILD layer 160 while keep the underlying CESL 158 substantially intact. Accordingly, after performing the etching process of the second ILD layer 160, some portions of the CESL 158 are exposed from the second via openings 162A and 162B. Furthermore, the second via openings 162A and 162B may vertically overlap the conductive features 140A and 140B.

Reference is made to FIG. 20. An etching process is performed to remove some portions of the CESL 158 and the second SAC hard mask portions 156A and 156B. For example, the portions of the CESL 158 exposed from the second via openings 162A and 162B of FIG. 19 and the underlying second SAC hard mask portions 156A and 156B are removed. In some embodiments, the CESL 158 and the second SAC hard mask portions 156A and 156B are made of the same material, and thus the portions of the CESL 158 and the second SAC hard mask portions 156A and 156B can be removed in the same etching process. Accordingly, during the etching process for removing the portions of the CESL 158 and the second SAC hard mask portions 156A and 156B, the second via openings 162A and 162B respectively extend toward the substrate 102 until the conductive caps 154A and 154B are exposed. In this regard, the conductive caps 154A and 154B can respectively protect the underlying conductive features 140A and 140B from be damaged by the etching process for removing the portions of the CESL 158 and the second SAC hard mask portions 156A and 156B. Furthermore, during the etching process, since the etching process for removing the portions of the CESL 158 and the second SAC hard mask portions 156A and 156B may be a selectively etching process, where the etchant(s) selectively remove the portions of the CESL 158 and the second SAC hard mask portions 156A and 156B while keep the gate spacer 120A-120E and the first SAC hard mask portions 134A and 134B substantially intact.

Reference is made to FIG. 21. A third via opening 164 is formed above the first gate stack 128A. The third via opening 164 can be formed by removing some portions of the second ILD layer 160, the CESL 158, and the first SAC hard mask portion 134A. The removal of the some portions of the second ILD layer 160, the CESL 158, and the first SAC hard mask portion 134A can be performed by any suitable process. For example, the removal may include an etching process performed by using a dry etching, wet etching, plasma etching process, or combinations thereof, so as to remove some portions of the second ILD layer 160, the CESL 158, and the first SAC hard mask portion 134A. In some embodiments, the etching process may stop until the first metal gate electrode 132A is exposed. During the etching process for removing the second ILD layer 160, the CESL 158, and the first SAC hard mask portion 134A, since the conductive features 140A and 140B are covered with the conductive caps 154A and 154B, the conductive caps 154A and 154B can respectively protect the underlying conductive features 140A and 140B from be damaged by the etching process. Therefore, the protection mechanism provided by the conductive caps 154A and 154B can result in the conductive features 140A and 140B keep substantially intact during the etching process for removing the second ILD layer 160, the CESL 158, and the first SAC hard mask portion 134A. Accordingly, the formation of the second via openings 162A and 162B may be prior to the formation of the third via opening 164.

Reference is made to FIG. 22. A second barrier layer 166 and a second conductive layer 168 are formed over the CESL 158 and the second ILD layer 160. The second barrier layer 166 is blanket formed over the CESL 158 and the second ILD layer 160, and the second conductive layer 168 is formed over the second barrier layer 166. After the formation of the second barrier layer 166 and the second conductive layer 168, some portions of the second barrier layer 166 are within the second and third via openings 162A, 162B, and 164, and the second conductive layer 168 fills into the second and third via openings 162A, 162B, and 164. In some embodiments, the second barrier layer 166 is a metal or metal alloy layer. The second barrier layer 166 may include Co, Ag, Al, Zn, Ca, Au, Mg, W, Mo, Ni, Cr, or combinations thereof, which may be deposited by using e.g., PVD, CVD, PECVD, LPCVD, or the like. In some embodiments, the second conductive layer 168 includes TiN, TaN, Ta, Ti, Hf, Zr, Ni, W, Co, Cu, or Al. In some embodiments, the second conductive layer 168 may be formed by CVD, PVD, plating, ALD, or other suitable technique. The second conductive layer 168 adheres to the second barrier layer 166. The second conductive layer 168 is deposited until the second and third via openings 162A, 162B, and 164 are over-filled.

Reference is made to FIG. 23. A planarization process such as CMP is performed to remove excess portions of the second ILD layer 160, the second barrier layer 166, and the second conductive layer 168. After the planarization process, the remained portions of the second barrier layer 166 and the second conductive layer 168 can collectively serve as a first contact plug 170A, a second contact plug 170B, and a third contact plug 170C. In some embodiments, the first contact plug 170A is within the third via opening 164 collectively defined by the first SAC hard mask portion 134A, the CESL 158, and the second ILD layer 160 and in contact with the top surface of the metal gate electrodes 132A, so as to electrically connect to the metal gate electrodes 132A. In some embodiments, the second contact plug 170B is within the second via opening 162A collectively defined by the second SAC hard mask portions 156A, the CESL 158, and the second ILD layer 160. The conductive cap 154A is between the conductive feature 140A and the second contact plug 170B, and the second contact plug 170B is in contact with the top surface of the conductive cap 154A, so as to electrically connect to the conductive feature 140A through the conductive cap 154A. In some embodiments, the third contact plug 170C is within the second via opening 162B collectively defined by the CESL 158 and the second ILD layer 160. The conductive cap 154B is between the conductive feature 140B and the second contact plug 170C, and the second contact plug 170C is in contact with the top surface of the conductive cap 154B, so as to electrically connect to the conductive feature 140B through the conductive cap 154B. Furthermore, after the planarization process, the second ILD layer 160 may have a thickness in a range from 5 nm to 50 nm.

As described above, the conductive features above the S/D regions are covered with the conductive caps which may have a different material from that of the conductive features. The conductive caps serve to protect the conductive features during the subsequent via formation processes. As the via formation process is performed by an etching process, the conductive caps can protect the conductive features from be damaged. Therefore, the protection mechanism provided by the conductive caps can result in the conductive features keep substantially intact during the via formation process.

According to various embodiments of the present disclosure, a semiconductor device includes a substrate, a gate stack, a gate spacer, a conductive feature, and a conductive cap. The substrate has a source/drain region. The gate stack is on the substrate. The gate spacer is alongside the gate stack. The conductive feature is on the source/drain region. The conductive cap is on the conductive feature and has a top in a position lower than a top of the gate spacer.

According to various embodiments of the present disclosure, a semiconductor device includes a substrate, a first gate stack, first gate spacer, a conductive cap, and a conductive feature. The substrate has a source/drain region. The first gate stack is on the substrate. The first gate spacer is alongside the first gate stack. The conductive cap is separated from the first gate stack by the first gate spacer. The conductive feature is between the source/drain region and the conductive cap.

According to various embodiments of the present disclosure, a method for manufacturing a semiconductor device includes steps as follows. A source/drain region is formed in a substrate and a gate stack on the substrate. A first hard mask is formed on the gate stack. A conductive feature is formed on the source/drain region. A second hard mask is formed above the conductive feature. The second hard mask is etched to forming a second via opening. After etching the second hard mask, the first hard mask is etched to form a first via opening to expose the gate stack. A first contact plug and a second contact plug are formed in the first via opening and the second via opening, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a source/drain region;
    a gate stack on the substrate;
    a gate spacer alongside the gate stack;
    a conductive feature on the source/drain region; and
    a conductive cap on the conductive feature and having a top in a position lower than a top of the gate spacer.

2. The semiconductor device of claim 1, wherein the conductive cap is in contact with the gate spacer.

3. The semiconductor device of claim 1, further comprising:
    a first dielectric mask on the conductive cap and in contact with the gate spacer.

4. The semiconductor device of claim 3, further comprising:
    a second dielectric mask stack on the gate stack and having a height greater than a height of the first dielectric mask.

5. The semiconductor device of claim 3, further comprising:
    an etch stop layer across the gate spacer, wherein the first dielectric mask is between the etch stop layer and the conductive cap.

6. The semiconductor device of claim 1, further comprising:
    a barrier layer in contact with the conductive cap and wrapping around the conductive feature.

7. The semiconductor device of claim 1, wherein the conductive cap comprises a material different from a material of the conductive feature.

8. A semiconductor device, comprising:
    a substrate having a source/drain region;
    a first gate stack on the substrate;
    a first gate spacer alongside the first gate stack;
    a conductive cap separated from the first gate stack by the first gate spacer;
    a conductive feature between the source/drain region and the conductive cap;
    a second gate stack on the substrate;
    a second gate spacer alongside the second gate stack, wherein the conductive cap is separated from the second gate stack by the second gate spacer; and
    a dielectric mask on the conductive cap and in contact with the first gate spacer and the second gate spacer.

9. The semiconductor device of claim 8, wherein the conductive cap is in contact with the first gate spacer and the second gate spacer.

10. The semiconductor device of claim 8, further comprising:
    a first contact plug on the first gate stack; and
    a second contact plug on the conductive cap and shorter than the first contact plug.

11. The semiconductor device of claim 8, further comprising:
    a first contact plug forming a first interface with the first gate stack; and
    a second contact plug forming a second interface with the conductive cap, wherein the first interface is in a position lower than the second interface.

12. The semiconductor device of claim 11, wherein the second contact plug extends to above the second gate stack.

13. The semiconductor device of claim 8, wherein the conductive cap and the first gate stack are respectively in contact with opposite sidewalls of the first gate spacer.

14. The semiconductor device of claim 8, wherein the conductive cap has a top surface lower than a top surface of the first gate spacer.

15. The semiconductor device of claim 8, wherein the dielectric mask has a top surface level with a top surface of the first gate spacer.

16. A method for manufacturing a semiconductor device, comprising:
    forming a source/drain region in a substrate and a gate stack on the substrate;
    forming a first hard mask on the gate stack;
    forming a conductive feature on the source/drain region;
    forming a second hard mask above the conductive feature;
    etching the second hard mask to form a second via opening;
    after etching the second hard mask, etching the first hard mask to form a first via opening to expose the gate stack; and
    forming a first contact plug and a second contact plug in the first via opening and the second via opening, respectively.

17. The method of claim 16, further comprising:
    forming a conductive cap on the conductive feature prior to forming the second hard mask.

18. The method of claim 17, wherein etching the second hard mask is performed until the conductive cap is exposed.

19. The method of claim 16, further comprising:
    performing an etch back process on the conductive feature; and
    after performing the etch back process, forming a conductive cap on the conductive feature.

20. The method of claim 19, wherein forming the conductive cap is performed such that a top surface of the conductive cap is in a position lower than a top surface of the first hard mask.

* * * * *